(12) United States Patent
Yates et al.

(10) Patent No.: US 7,943,269 B2
(45) Date of Patent: May 17, 2011

(54) ION-/PROTON-CONDUCTING APPARATUS AND METHOD

(75) Inventors: Matthew Yates, Penfield, NY (US); Dongxia Liu, Rochester, NY (US)

(73) Assignee: University of Rochester, Rochester, NY (US)

(*) Notice: Subject to any disclaimer, the term of this patent is extended or adjusted under 35 U.S.C. 154(b) by 28 days.

(21) Appl. No.: 12/392,150

(22) Filed: Feb. 25, 2009

(65) Prior Publication Data

US 2010/0015494 A1    Jan. 21, 2010

Related U.S. Application Data

(60) Provisional application No. 61/031,492, filed on Feb. 26, 2008, provisional application No. 61/101,314, filed on Sep. 30, 2008.

(51) Int. Cl.
*H01M 8/10* (2006.01)
*C01B 15/16* (2006.01)

(52) U.S. Cl. .................. 429/491; 423/308; 427/115

(58) Field of Classification Search .............. 429/30, 429/33, 465, 479, 491; 427/2.27, 115; 205/198; 423/308
See application file for complete search history.

(56) References Cited

U.S. PATENT DOCUMENTS

| | | | | |
|---|---|---|---|---|
| 4,992,342 A * | 2/1991 | Singh et al. | ............ | 429/44 |
| 2001/0044043 A1* | 11/2001 | Badding et al. | ............ | 429/40 |
| 2004/0191603 A1* | 9/2004 | Kaiser et al. | ............ | 429/34 |
| 2005/0026006 A1* | 2/2005 | Haile et al. | ............ | 429/13 |

OTHER PUBLICATIONS

G. Maiti, F. Freund. Influence of Fluorine Substitution on the Proton Conductivity of Hydroxyapatite, J. Chem. Soc. Dalton Trans. 1981, 949-955.*

K. Yamashita, H. Owada, T. Umegaki, T. Kanazawa. Protonic Conduction in Yttrium-substituted Hydroxyapatite Ceramics and Their Applicability to H2—O2 fuel cell, Solid State Ionics 1990, 40-41, 918-921.*

K. Yamashita, K. Kitagaki, T. Umegaki. Thermal Instability and Proton Conductivity of Ceramic Hydroxyapatite at High Temperatures, J. Am. Ceram. Soc. 1995, 78(5), 1191-1197.*

(Continued)

*Primary Examiner* — Patrick Ryan
*Assistant Examiner* — Carlos Barcena
(74) *Attorney, Agent, or Firm* — William Greener; Bond, Schoeneck & King, PLLC

(57) ABSTRACT

A c-axis-oriented HAP thin film synthesized by seeded growth on a palladium hydrogen membrane substrate. An exemplary synthetic process includes electrochemical seeding on the substrate, and secondary and tertiary hydrothermal treatments under conditions that favor growth along c-axes and a-axes in sequence. By adjusting corresponding synthetic conditions, an HAP this film can be grown to a controllable thickness with a dense coverage on the underlying substrate. The thin films have relatively high proton conductivity under hydrogen atmosphere and high temperature conditions. The c-axis oriented films may be integrated into fuel cells for application in the intermediate temperature range of 200-600° C. The electrochemical-hydrothermal deposition technique may be applied to create other oriented crystal materials having optimized properties, useful for separations and catalysis as well as electronic and electrochemical applications, electrochemical membrane reactors, and in chemical sensors.

38 Claims, 18 Drawing Sheets

(a)    (b)    (c)

OTHER PUBLICATIONS

Y. Fujishiro, T. Sato, A. Okuwaki. Coating of hydroxyapatite on metal plates using thermal dissociation of calcium-EDTA chelate in phosphate solutions under hydrothermal conditions, J. Mater. Sci. Mater. Med. 1995, (6), 172-176.*

S. Nakamura, H. Takeda, K. Yamashita. Proton transport polarization and depolarization of hydroxyapatite ceramics, J. Appl. Phys. 2001, 89(10), 5386-5392.*

A. Bouhaouss A. Laghzizil, A. Bensaoud, M. Ferhat, G. Lorent, J. Livage. Mechanism of ionic conduction in oxy and hydroxyapatite structures, Inter. J. Inorg. Mater. 2001, 3, 743-747.*

D. Liu, K. Savino, M. Z. Yates. Microstructural Engineering of Hydroxyapatite Membranes to Enhance Proton Conductivity, Adv. Funct. Mater. 2009, 19, 3941-3947.*

D. Liu. Engineering Particle Morphology and Assembly for Proton Conducting Fuel Cell Membrane Applications, Dissertation, University of Rochester, 2009.*

H. Kim, Y. K. Vohra, W. R. Lacefield, R. P. Camata. Mechanical properties of pulsed laser-deposited hydroxyapatite thin films for applications in biomedical implants, Mat. Res. Soc. Symp. Proc. 2003, 750, Y8.13.1-Y8.13.6.*

J. G. Wolke, K. van Dijk, H. G. Schaeken, K. de Groot, J. A. Jansen. Study of the Surface Characteristics of Magnetron-sputter calcium phosphate coatings, J. Biomed. Mater. Res. 1994, 28(12), 1477-1484.*

D.-M. Liu, Q. Yang, T. Troczynski. Sol-gel hydroxyapatite coatings on stainless steel substrates, Biomater. 2002, 23, 691-698.*

Govender et al.; Understanding the Factors that Govern the Deposition and Morphology of Thin Films of ZnO From Aqueous Solution; Journal of Materials Chemistry; 2004,14, 2575-2591; The Royal Society of Chemistry 2004.

Karanikolos et al.; Continuous c-Oriented AlPO-5 Films by Tertiary Growth; Chemistry of Materials; Chem. Mater., 2007, 19 (4), 792-797, DOI: 10.1021/cm0622295; American Chemical Society, 1155 Sixteenth Street N.W., Washington, DC 20036.

Ito et al.; New Intermediate Temperature Fuel Cell with Ultra-Thin Proton Conductor Electrolyte; Journal of Power Sources 152 (2005) 200-203; copyright 2005 Elsevier B.V.

Harada et al.; Effect of Substrate Metal on the Electrochemical Deposition of Calcium Phosphate; Bioceramics; vol. 9; 1996; 325-328.

Ban et al.; Morphological Regulation and Crystal Growth of Hydrothermal-Electrochemically Deposited Apatite; Biomaterials 23 (2002) 2965-2972; Elsevier Science Ltd.

Ban et al.; Hydrothermal-Electrochemical Deposition of Hydroxyapatite; 1998 John Wiley & Sons, Inc. J. Biomed Mater Res, 42, 387-395.

Suchanek et al.; Biocompatible Whiskers with Controlled Morphology and Stoichiometry; J. Mater. Res., vol. 10, No. 3, 521-529, Mar. 1995; Materials Research Society.

Andres-Verges et al.; Hydrothermal Synthesis of Calcium Deficient Hydroxyapatites with Controlled Size and Homogeneous Morphology; Journal of the European Ceramic Society 18 (1998) 1245-1250; 1998 Elsevier Science Limited.

Inagaki, M et al.; Phase transformation of plasma-sprayed hydroxyapatite coating with preferred crystalline orientation; Elsevier, Biomaterials 28 (2007) 2923-2931.

Escudero et al., Electrochemical Behaviour of Lithium-nickel Oxides in Molten Carbonate; Journal of Power Sources; Elsevier; 118; 2003; 23-34.

Huang et al., Performance of Fuel Cells with Proton-conducting Ceria-based Composite Electrolyte and Nickel-based Electrodes; Journal of Power Sources; Elsevier; 175; 2008; 238-243.

* cited by examiner a-planes: positively charged
c-planes: negatively charged

ION-/PROTON-CONDUCTING APPARATUS AND METHOD

RELATED APPLICATION DATA

The instant application claims priority to U.S. Provisional application Ser. No. 61/031,492 filed on Feb. 26, 2008 and to U.S. Provisional application Ser. No. 61/101,314 filed on Sep. 30, 2008, the subject matters of which are hereby incorporated by reference in their entireties.

FEDERALLY SPONSORED RESEARCH

Certain embodiments and aspects of the disclosed invention were made with government support under Contract Nos. DE-FG02-05ER15722 and DE-FC03-92SF19460 awarded by the United States Department of Energy. The United States government may have certain rights in the invention.

BACKGROUND

1. Field of the Invention

Embodiments of the invention pertain generally to the field of ion and/or proton conducting membranes. More particularly, embodiments of the invention are directed to ion and/or proton conducting membranes, devices incorporating ion and/or proton conducting membranes, methods of fabrication of ion and/or proton conducting membranes and devices incorporating same, and applications for said membranes, particularly, but not limited to, fuel cells, gas sensors, and electrocatalytic devices.

2. Description of Related Art

Ion conducting membranes are used in fuel cells, electrochemical membrane reactors, and in chemical sensors. In these exemplary applications, the membrane is electrically insulating but is conductive to protons or oxygen ions. In fuel cells, the membrane performance largely determines the fuel cell operating conditions and, as a result, the design of the entire fuel cell device. The two most common classes of fuel cells are polymeric electrolyte membrane fuel cells (PEMFCs) and solid oxide fuel cells (SOFCs). The ion exchange membranes in PEMFCs are polymers that function most effectively below 100° C. There are no polymeric ion conducting membranes reported that operate effectively above 200° C. The upper temperature limit on polymeric ion conducting membranes means that expensive platinum catalysts should be used for the oxidation and reduction reactions in fuel cells.

The ion exchange membranes in SOFCs are ceramics that operate most effectively at temperatures above 700° C. The temperature is high enough to allow non-precious metal catalysts to be effective for the oxidation and reduction reactions in fuel cells. However, the SOFC operating temperature is sufficiently high that stress from thermal cycles can, and often does, lead to device failure.

There is currently significant interest in developing effective and commercially viable ion conducting membranes that can be used in an intermediate temperature range between about 200-600° C. The discovery of an effective intermediate temperature ionic conducting membrane could truly revolutionize the fuel cell industry. The intermediate temperature range of 200-600° C. would be low enough to allow fuel cell construction using low cost materials, but high enough to use non-precious metal catalysts and allow internal fuel reforming of hydrocarbon fuels.

Previous approaches to creating membranes suitable for the intermediate temperature range have focused on either finding new ion conductors with higher conductivity, or making existing membranes thinner to reduce overall resistance.

Very thin ceramic membranes are too fragile to be self-supporting, and are typically supported in fuel cell devices by either the anode or cathode material. Ito et al., ("New Intermediate Temperature Fuel Cell with Ultra-Thin Proton Conductor Electrolyte" *J. Power Sources* 2005, vol. 152, pp. 200-203) report a fuel cell that uses a palladium foil hydrogen membrane to support an ultrathin (~700 nm thickness) $BaCe_{0.8}Y_{0.2}O_3$ ceramic known to exhibit purely protonic conductivity below 600° C. The palladium foil not only supports the thin proton conducting layer, but simultaneously serves as a fuel cell anode and as a hydrogen membrane. After coating the proton conducting layer with a perovskite ceramic cathode, they referred to the resulting three layer structure as a "hydrogen membrane fuel cell" or HMFC, as illustrated generically in FIG. 1. At temperatures above 300° C., hydrogen dissolves into the palladium in the form of protons and electrons. The protons travel through the palladium foil and then through the proton conducting ceramic. Since the proton conducting ceramic is electrically insulating, the electrons are forced to travel from the palladium through an external circuit to the cathode, thereby generating electricity. The reported performance of the HMFC demonstrated a maximum power density of 0.9 $W/cm^2$ at 400° C. and 1.4 $W/cm^2$ at 600° C.

One significant limitation in the HMFC described above is the use of pulsed laser deposition to create the thin film of ceramic on palladium. Pulsed laser deposition is a high vacuum technique that is known to be unsuitable for economically coating large surface areas (the reported HMFC was in the shape of a circle only six millimeters in diameter). The pulsed laser deposition technique is also difficult if not impossible to employ to coat non-planar substrates, such as the interior of a tube, for example.

Zeolite and molecular sieves have been reported in which mass transport occurs through pores in the crystalline framework of the material. Thin zeolite and molecular sieve membranes can be deposited through chemical methods on both planar and tubular supports. Mass transport inside zeolite and molecular sieve crystals is typically anisotropic, with the most favorable mass transport occurring along one crystal axis. Multicrystalline zeolite and molecular sieve membranes with randomly oriented crystal domains are not optimal for mass transport due to the random mass transport path through the membrane and resistance to mass transport at boundaries between crystal domains. Lai et al., ("Microstructural Optimization of a Zeolite Membrane for Organic Vapor Separation" *Science* 2003, Vol. 300 pp. 456-460 demonstrate enhanced zeolite membrane performance by adjusting chemical synthesis conditions to optimize the membrane microstructure to promote mass transport. The optimized membranes have zeolite crystal domains aligned with the crystal axis giving preferred mass transport oriented normal to the membrane surface. In addition, the crystal domains largely span the membrane thickness to reduce or eliminate resistive boundaries between crystal domains in the direction through the membrane thickness. An analogous microstructural optimization approach has not been extended to ion or proton conducting membranes.

Hydroxyapatite ($Ca_{10}(PO_4)_6(OH)_2$, or "HAP") is a type of calcium phosphate that has a hexagonal crystallographic structure, which is thermally stable up to 1400° C. The stoichiometric Ca/P molar ratio is 1.67 for stoichiometric HAP, but the apatite crystal structure can be formed with nonstoichiometric Ca/P ratios and with partial substitution of other ions such as chlorine, fluorine, and yttrium into the crystal framework. High temperature electrochemical investigations have indicated that HAP is proton conductive, with the mechanism of conduction hypothesized to be migration of protons along hydroxyl groups lining the c-axis of the crystals. Since proton conduction occurs primarily along one crystal axis (c-axis) in HAP, it is expected that conductivity will be strongly anisotropic in a single crystal. However, there is no reported study to date of high temperature proton conductivity in singe crystals of HAP due to the difficulty of synthesizing large-sized HAP single crystals.

Ban et al., "Hydrothermal-Electrochemical Deposition of Hydroxyapatite", *J. Biomed. Mater. Res.*, 1998, Vol. 42, pp. 387-395 and Ban et al. "Morphological Regulation and Crystal Growth of Hydrothermal-Electrochemically Deposited Apatite", *Biomaterials*, 2002, Vol. 23, pp. 2965-2972 have reported electrochemical/hydrothermal synthesis of thin films of hydroxyapatite on titanium and stainless steel electrodes to make the metal surfaces biocompatible for orthopedic implants. Similar synthesis of hydroxyapatite crystals onto palladium-based hydrogen membranes, useful for fuel cell applications, has not been reported. Electrochemical growth onto palladium membranes is particularly challenging due to hydrogen embrittlement. Embrittlement refers to the membrane warping and damage that occurs when pure palladium is exposed to hydrogen at temperatures below 293° C. The use of palladium alloys rather than pure palladium mitigates warping to some extent, but does not eliminate issues of hydrogen embrittlement. During hydrothermal-electrochemical synthesis, hydroxyapatite nucleation and growth is driven by a local increase in pH near the cathode that accompanies electrolysis of water. As a result, hydroxyapatite grows only on the cathode, not the anode. Since hydrogen gas is evolved at the cathode during electrolysis, the hydroxyapatite cannot be electrochemically deposited without exposing the palladium membrane directly to hydrogen gas.

In view of the foregoing discussion and the known shortcomings of current technology, the inventors have recognized that improvements to the current state of the art and solutions to the known problems in the art will be beneficial and advantageous. These improvements and solutions will be set forth in the following description of embodiments of the invention, the figures, and as recited in the appended claims.

SUMMARY DISCUSSION

An embodiment of the invention is directed to an ion-/proton-conducting membrane. The membrane has selectively oriented crystal c-axes that facilitate (and are intended to optimize) ion/proton transport. Compared to current ceramic membranes, the membrane is relatively thin and has single crystal domains spanning the membrane thickness. The membrane is also sufficiently dense to provide a gas-tight barrier. By optimizing proton transport, a fuel cell incorporating such a membrane should operate at lower temperatures than is currently possible with standard ceramic membranes. In a non-limiting aspect, the film is apatite crystals. In a more particular aspect, HAP is the ion-/proton-conducting material. Alternative crystalline ion-/proton-conducting materials may include, but are not limited to, zirconia, yttrium stabilized zirconia, lanthanum gallates, cerium dioxide, bismuth oxides, lanthanum-molybdenum oxides, brownmillerite, perovskite aluminates, apatite-type silicates, fluorite-type oxides, barium cerates, barium titanates, and strontium cerates. The ion/proton conducting membrane further comprises a substrate. According to a non-limiting aspect, the substrate is palladium. Alternatively, the substrate may be a palladium alloy or nickel, or a non-metallic (e.g., ceramic) material. In an aspect, the substrate may be removable; i.e., a sacrificial substrate.

An embodiment of the invention is directed to a hydrogen fuel cell. If the hydroxyapatite film on palladium (or nickel, for example) is coated with an electrically conducting cathode layer, the resulting structure will be a hydrogen membrane fuel cell. The fuel cell includes an anode, a cathode, and an ion-/proton-conducting membrane disposed between the anode and the cathode, wherein the ion-/proton-conducting membrane further comprises a hydroxyapatite (HAP) thin film having a thickness t. The HAP thin film is characterized by a plurality of single HAP crystals each having its c-axis oriented normal to the substrate in the form of a gas tight film, further wherein each of the single HAP crystals has a crystal domain that substantially spans the film thickness t. According to an exemplary aspect, the cathode material is $Ba_{0.5}Sr_{0.5}Co_{0.8}Fe_{0.2}O_{3-\delta}$ (BSCF), a ceramic with very good performance as a fuel cell cathode in the temperature range of 500-700° C. Synthesized BSCF powder can be converted into a paste that can be painted onto, or otherwise applied to, an ion conducting ceramic and sintered to form a fuel cell cathode layer. Possible alternative intermediate temperature cathode materials include other perovskite ceramics such as LaSrCoFeO, lithiated nickel oxides such as $Li_xNiO_{2+}$ (x=0.05-1.0), or other metal oxides with or without lithiation. The fuel cell will exhibit a proton conductivity equal to or greater than 1E-6 S/cm over a temperature range between about 300° C. to 900° C. and, in an aspect will operate in the temperature range of 300° C.-600° C. An exemplary device will be a new type of fuel cell membrane based on ion conduction through single crystals aligned to maximize proton transport.

An embodiment of the invention is directed to a method for making an ion-/proton conducting membrane. The method includes the steps of creating a seeded surface by depositing a sufficiently dense HAP seed layer onto a hydrogen membrane, hydrothermally synthesizing a crystalline HAP film on the seeded surface in a secondary, single crystallization that results in the crystal c-axis oriented substantially normal to the seeded surface, and hydrothermally densifying the HAP to form a gas-tight thin film by a tertiary crystallization that promotes a-axis crystal growth perpendicular to the c-axis. In a non-limiting aspect, the seed layer is directly grown on a pure palladium hydrogen membrane acting as a cathode during electrochemical synthesis. By optimizing proton transport, fuel cells may have improved performance and be operated at lower temperatures than possible with standard ceramic membranes. In addition, by growing the proton conducting membrane electrochemically directly onto hydrogen membranes, the proton conductor can easily and inexpensively be coated onto large surface areas and onto tubular geometry often used for hydrogen membranes. According to an aspect of the method, palladium embrittlement can be mitigated by reducing an amount of evolved hydrogen at the cathode electrode. This may be accomplished by applying an electrical current equal to or less than 10 mA/cm$^2$ and/or limiting the deposition time to between about five minutes to one minute. According to an aspect, the method involves controlling supersaturation of HAP to mediate crystal nucleation and growth to achieve thin film densification and/or to control the resulting thickness of the thin film; advantageously, controllably reducing the film thickness from about 10 μm to 1-2 μm or less. According to another aspect, a crystal growth modifier is added to alter growth rate of the crystal a-axis relative to the crystal c-axis in order to promote growth of a dense gas-tight film.

DETAILED DESCRIPTION OF EXEMPLARY EMBODIMENTS OF THE INVENTION

Figure 1:
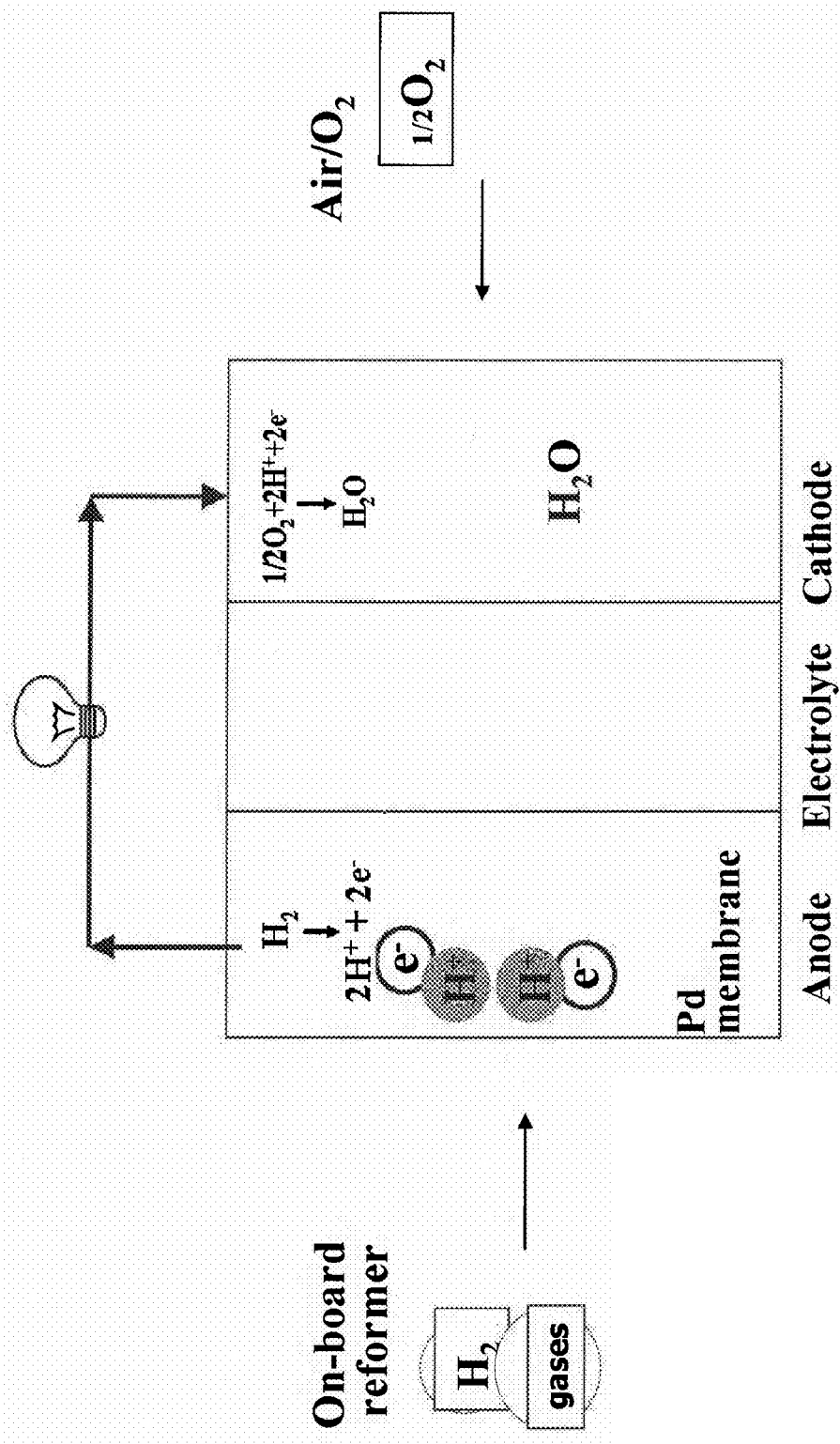
FIG. 1 schematically shows a generic hydrogen membrane fuel cell as known in the art.
Figure 2:
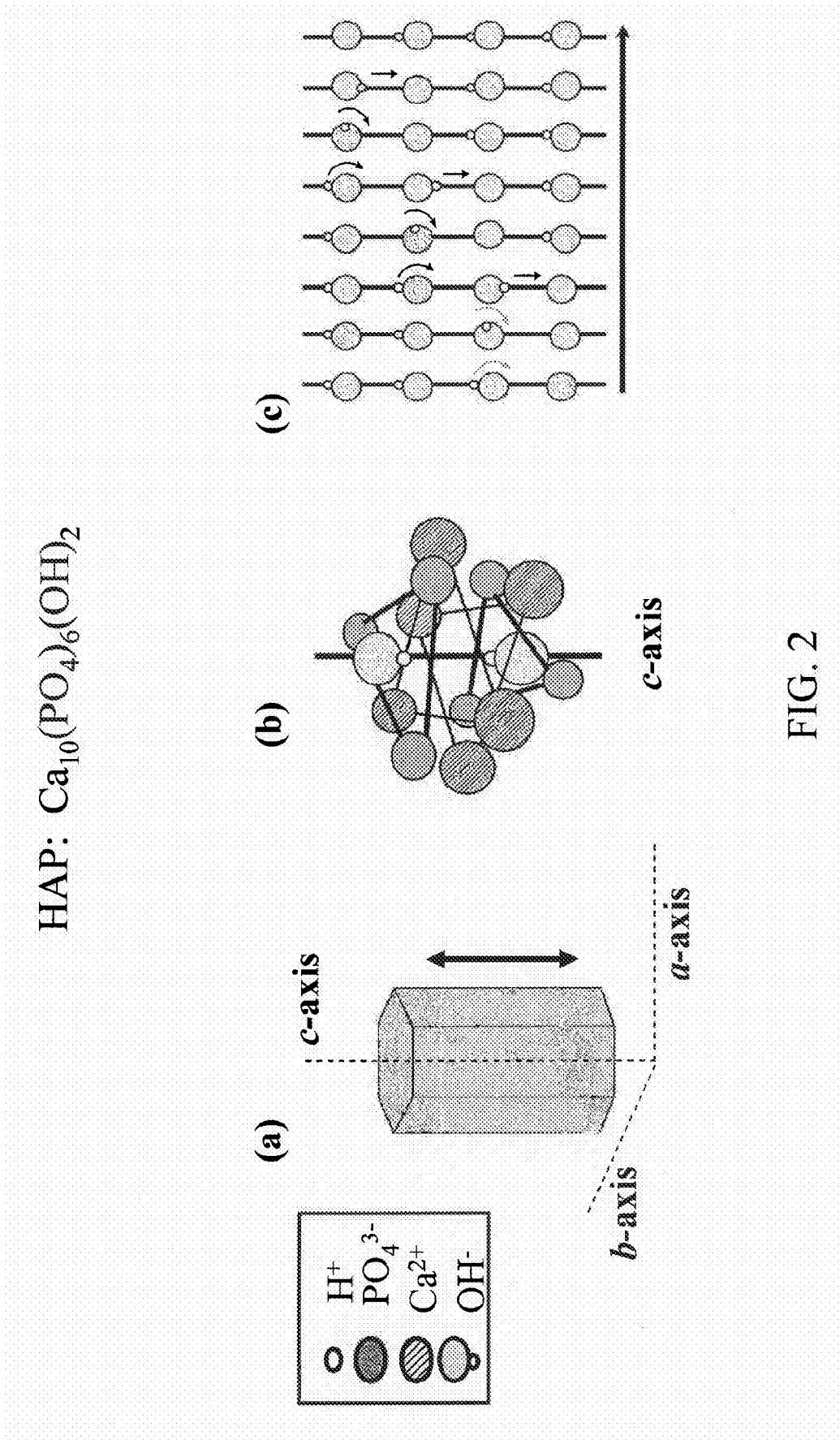
FIG. 2 schematically illustrates (a) the typical shape of a HAP single crystal, (b) the atomic environment around OH-ions, and (c) proton transportation along the c-axis of the HAP crystal.

As mentioned above, optimal performance of a hydroxyapatite ion-/proton-conducting membrane occurs when the crystal domains span the entire thickness of the membrane to eliminate grain boundary resistance across the thickness of the membrane. In addition, the crystal's c-axis would be aligned so that the proton transport path is optimized, as illustrated in FIGS. 2(a-c).

Figure 3:
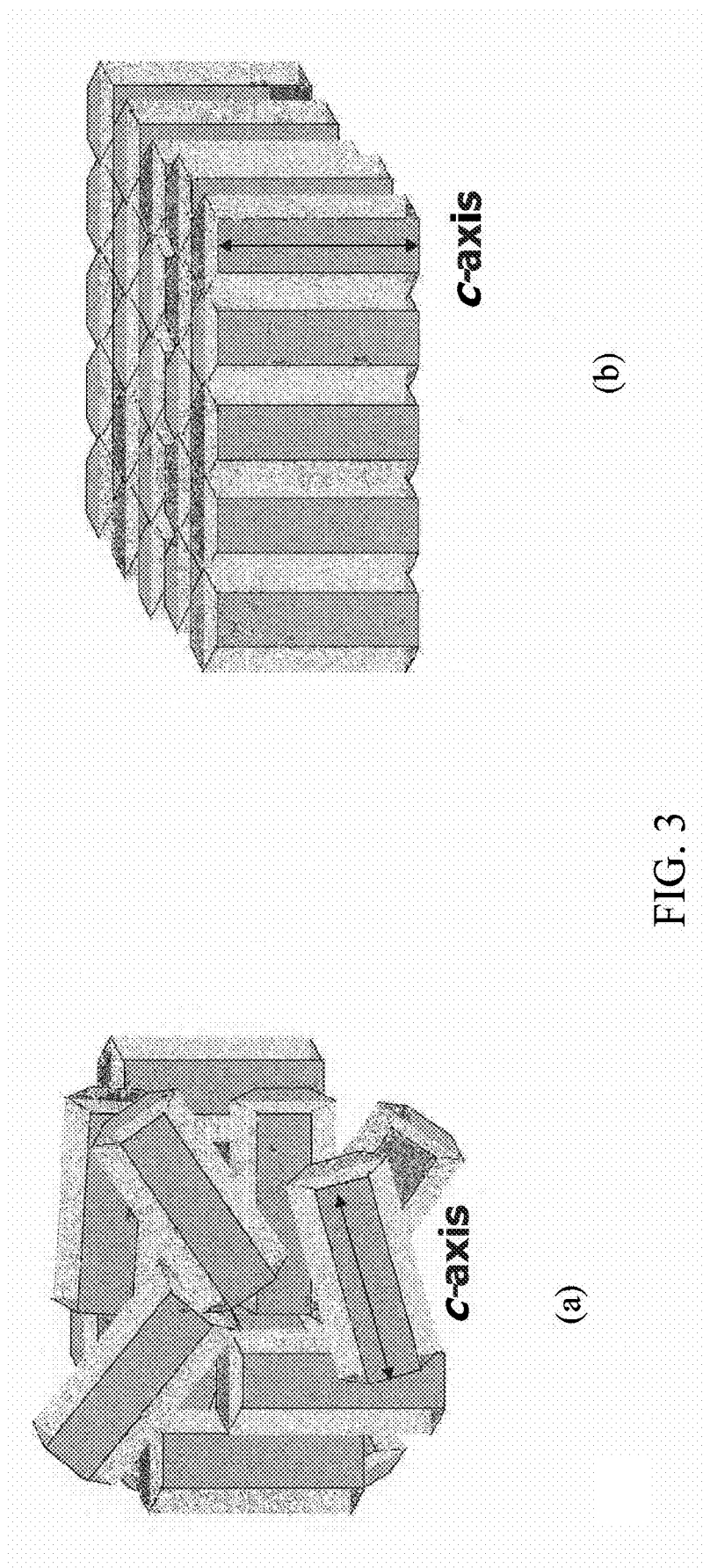
FIG. 3(a) schematically illustrates a randomly oriented HAP crystal membrane structure.
FIG. 3(b) schematically illustrates an ideal HAP membrane structure with the c-axes of crystal domains spanning the entire membrane thickness to optimize proton transport.
Figure 4:
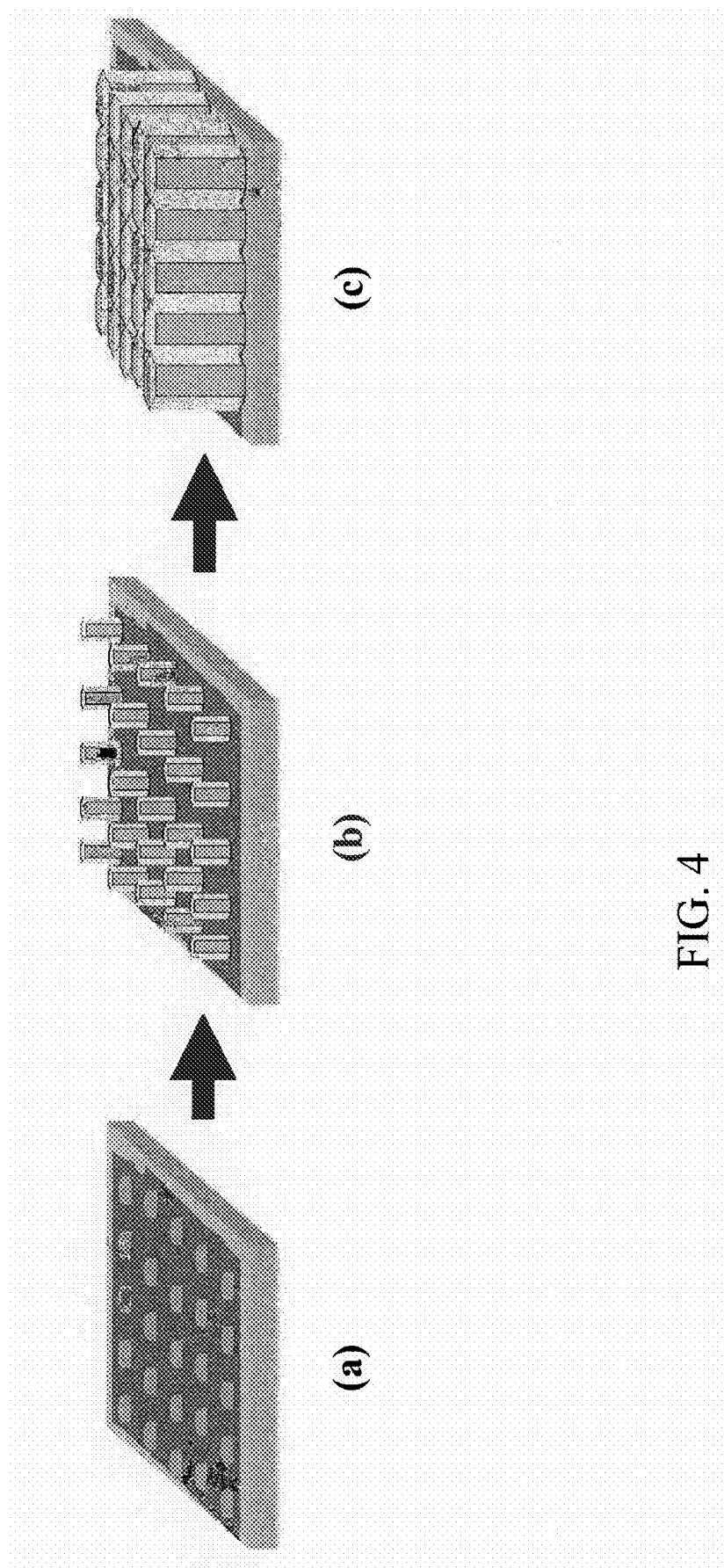
FIG. 4 schematically shows (a) Seeding: an electrochemical seed deposition of HAP on a Pd substrate; (b) Secondary growth: hydrothermal deposition under conditions that favor c-axis growth to yield oriented columnar crystals; (c) Tertiary growth: hydrothermal deposition under conditions that favor a-plane growth to obtain oriented, dense (gas-tight) crystalline films, according to an illustrative embodiment of the invention.
Figure 8:
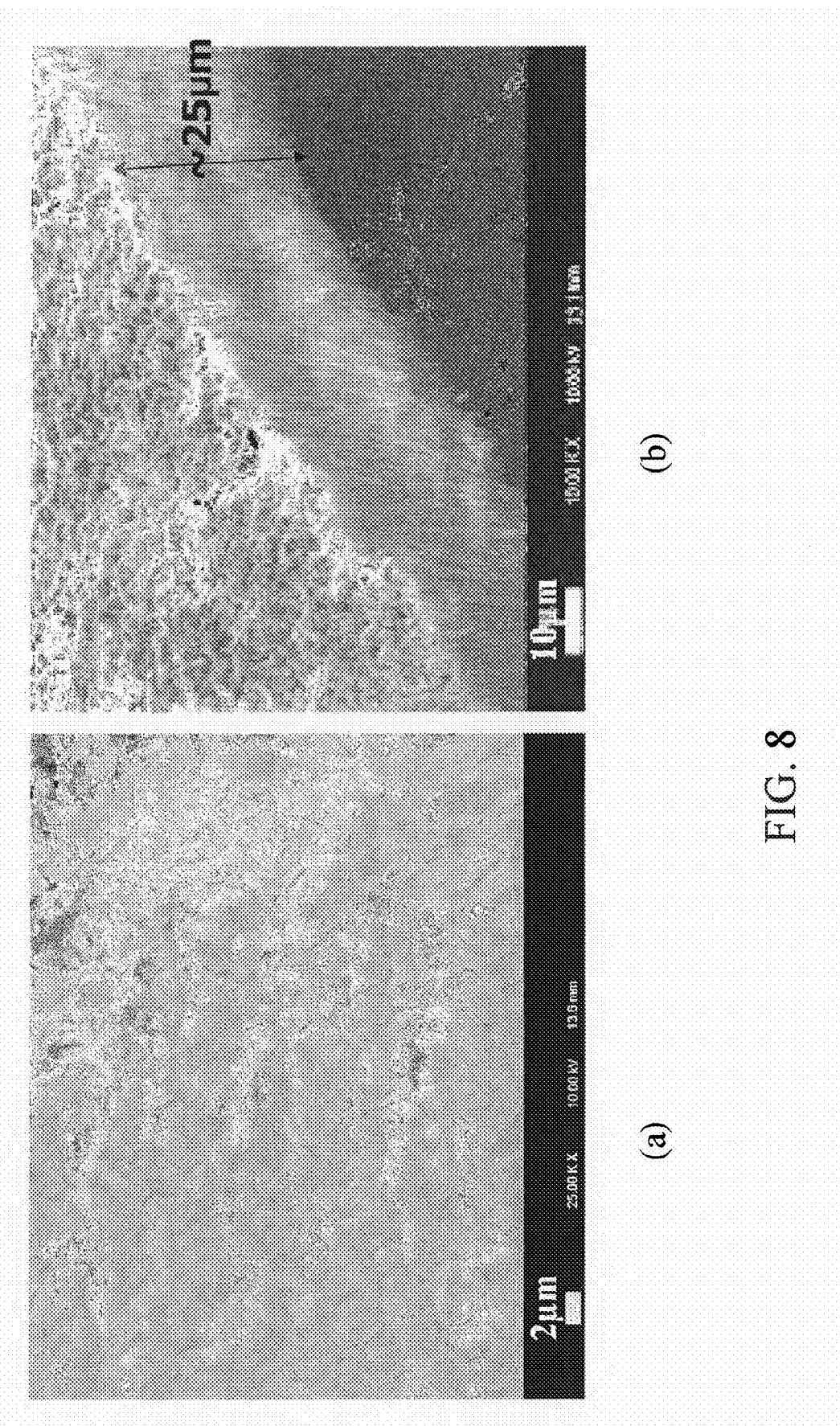
FIG. 8a is a top-view SEM image of tertiary growth of HAP crystals on a Pd membrane.
FIG. 8b is a side-view SEM image of FIG. 8a, according to an illustrative embodiment of the invention.
Figure 13:
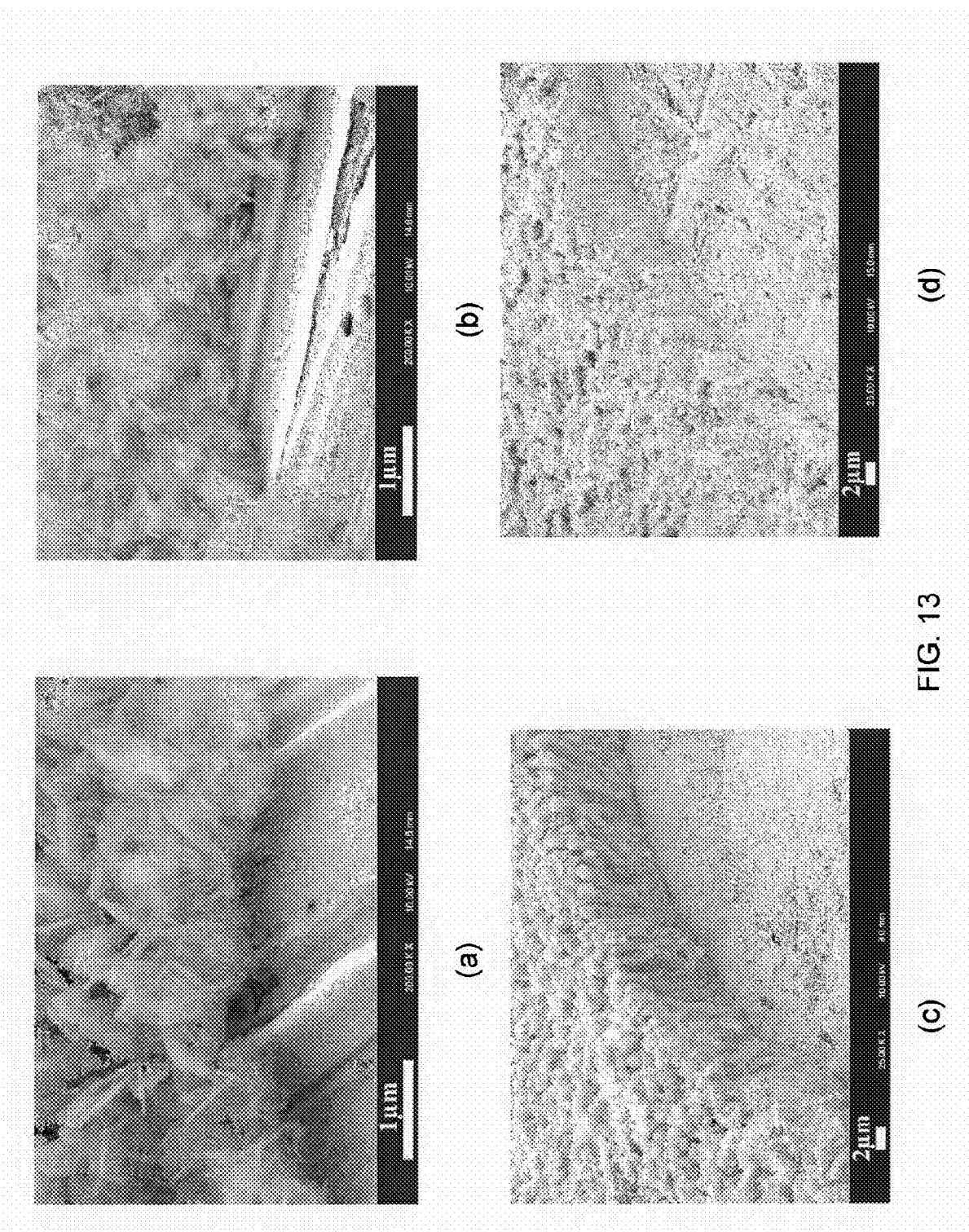
FIGS. 13(a-d) show SEM images of HAP seed layers on a palladium substrate prepared by electrochemical deposition at 9.5 mA/cm² current density in (a) 2 minutes and (b) 1 minute; (c) and (d) show the morphology of HAP films after tertiary hydrothermal synthesis grown from the seed layer (a) and (b), respectively, according to an illustrative aspect of the invention.

FIG. 3(a) schematically shows HAP crystals that are randomly oriented. FIG. 3(b), on the other hand, schematically shows an ideal HAP membrane structure with the c-axes of crystal domains spanning the entire membrane thickness to optimize proton transport;

A non-limiting, exemplary ion/proton conducting membrane 400-1 as illustrated in FIG. 4(c) includes a substrate 402 and a crystalline ion-conducting thin film 304 (also shown in FIG. 3(b)) having a thickness t. The thin film is characterized by a plurality of single apatite crystals 304' each having its c-axis oriented normal to the substrate (as also shown in FIG. 8(b) and FIGS. 13(a-c)). The apatite film is grown sufficiently dense (as described in more detail below) to form a gas-tight film (see, e.g., FIGS. 8(a, b). Each of the single crystals has a crystal domain that substantially spans the film thickness t as illustrated in FIG. 3(b).

According to an aspect, the hydroxyapatite membrane is grown onto a palladium substrate. Two types of palladium substrates can be considered: thin foils and palladium deposited on porous supports. Palladium foils are currently commercially available in thicknesses as low as 25 μm. Palladium foils have smooth surfaces that make them attractive as model substrates for viewing hydroxyapatite crystal growth via electron microscopy. However, unsupported palladium foils are flexible. Bending of the palladium foil can cause the deposited hydroxyapatite layer to crack. For hydrogen membranes, palladium is often deposited onto porous supports comprised of stainless steel, nickel, ceramics, glass, or silicon. The porous support provides mechanical stability, allowing very thin palladium membranes to be used for gas separation. Thinner membranes save cost by reducing the amount of palladium required per unit surface area and improve mass transport of hydrogen by lowering membrane resistance. Porous stainless steel plates and tubes can advantageously be used as palladium supports. The palladium is deposited following well-established electroless deposition processes after sensitizing the surface of the porous stainless steel in acidic $PdCl_2$ and $SnCl_2$ solutions.

Figure 5:
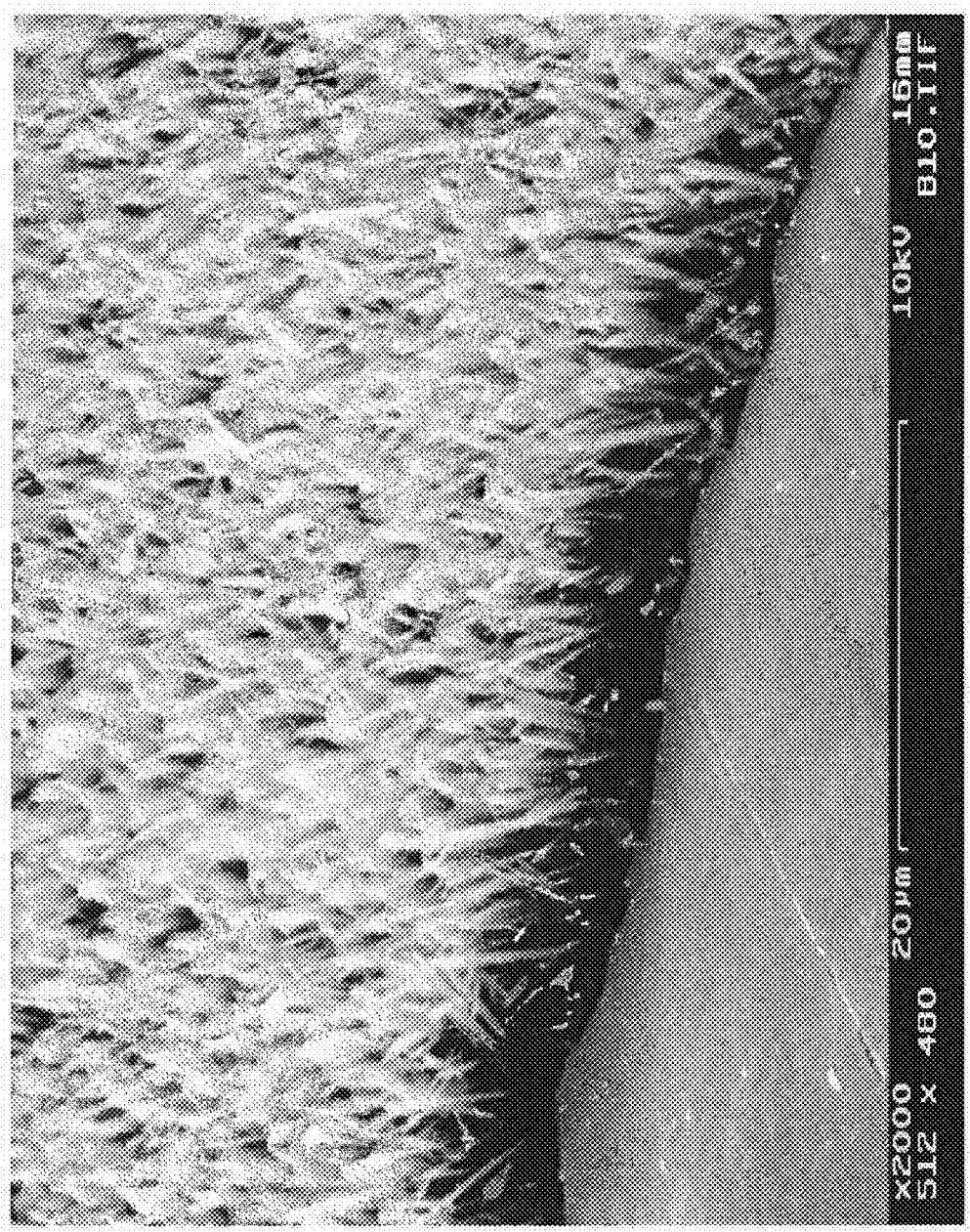
FIG. 5 is a side-view SEM image showing the morphology of HAP deposited onto a 50 μm thick palladium/silver (75/25) alloy, according to an illustrative embodiment of the invention.

Alternatively, the substrate may be a palladium alloy. FIG. 5 shows the morphology of HAP deposited onto a 50 μm thick palladium/silver 75/25 alloy foil. It can be seen that the c-axis crystal growth is normal to the substrate surface. Palladium/copper may also provide a suitable alloy.

In order to realize the ideal membrane structure illustrated in FIG. 4(c), "secondary growth" and "tertiary growth" processes are used, as illustrated in FIGS. 4(b), (c), respectively.

In both processes, a seed layer is first deposited to promote crystal growth on the surface as illustrated in FIG. 4(a). In the secondary growth process (FIG. 4(b)), a dense crystalline film is produced in a single secondary crystallization onto the seeded surface. In a tertiary growth process, the secondary crystallization step promotes c-axis growth normal to the substrate but does not necessarily result in a dense film. A tertiary crystallization step (FIG. 4(c)) is then applied to promote a-axis growth (the a-axis is perpendicular to the c-axis) to densify the film and form a gas-tight barrier. To develop an effective secondary and tertiary growth processes for hydroxyapatite, a seed layer must first be formed with good surface coverage. Methods are then used to control the crystallization kinetics, and adjust the growth rate of the crystal c-axis relative to the a-axis to grow a dense crystalline film onto the seed layer.

The following detailed description of seeding, secondary, and tertiary growth processes are exemplary, illustrative, demonstrative, and non-limiting.

Preparation of HAP Seeds on Palladium Substrates

Palladium substrates were prepared by electroless plating of a thin layer of palladium onto porous stainless steel supports following a reported procedure. The porous stainless steel supports were cleaned with an alkaline solution in an ultrasonic bath at ~60° C. followed by a surface activation by successively immersing the supports in acidic baths of $SnCl_2$ and $PdCl_2$. The palladium deposition was then conducted by immersing the activated supports in a plating solution for approximately three hours. The plating procedure was repeated until a desired film thickness was obtained. Typically, the thickness of the plated palladium film was around 20 μm, which was thick enough to seal the pores at the surface of the porous stainless steel supports. The porous stainless steel support ensures the mechanical stability of the thin palladium membranes. Thin palladium film improves mass transport of hydrogen by lowering membrane resistance.

HAP seeds were deposited onto the palladium substrate surface via an electrochemical deposition process. First, the palladium substrate was washed with an industrial soap solution, ultrasonicated in ethanol/acetone (volume ratio=50:50) solvent for 30 min, and then rinsed with deionized water for use as a cathode electrode in the electrochemical deposition reaction. The anode electrode was a platinum plate (25 mm×25 mm×127 μm). The anode and cathode electrodes were fixed onto two pieces of Teflon® material plates and arranged face to face with a separation distance of 10 mm. The entire assembly was immersed in the electrolyte solution preheated in an oil-bath (~95° C.) for the HAP film growth. The electrolyte solution was prepared as described in the literature, consisting of 1.67 mM $K_2HPO_4$, 2.5 mM $CaCl_2$ and 138 mM NaCl in deionized water. The solution was buffered to pH 7.2 using tris(hydroxymethyl)-aminomethane and 37% hydrochloride acid. A constant current was generated with a direct current power supply and applied to the electrodes for a desired time. After the electrochemical deposition, the cathode palladium electrode seeded with HAP crystals was taken out of the electrolyte solution, rinsed with deionized water several times, and dried in air.

Secondary Growth of HAP

The palladium substrate covered with the HAP seed layer was placed in a Teflon-lined vessel (40 ml of internal volume) with the seed layer facing down and tilted up at approximately 45 degrees relative to the bottom of the vessel. The synthetic solution was prepared by dissolving $Na_2EDTA$ (0.20 M) and $Ca(NO_3)_2$ (0.20 M) in 15 ml deionized water, and $(NH_4)_2HPO_4$ (0.12 M) in the other 15 ml deionized water to form the calcium and phosphate source solutions. The two source solutions were mixed together after pH of each solution was raised to 10.0 with ammonium hydroxide. The synthetic solution was stirred at room temperature for about 20 minutes and then transferred into the Teflon-lined vessel to immerse the seed layer seated on the palladium substrate. The Teflon-lined vessel was sealed in a stainless steel autoclave and put into a convective oven for the hydrothermal synthesis for 15 hours at 200° C. and autogenous pressure. After the reaction, the autoclave was cooled to room temperature in a fume hood. The sample was taken out, rinsed with deionized water several times, and dried in air.

Tertiary Growth of HAP

The set-up for tertiary hydrothermal growth was the same as secondary growth except that the HAP-covered palladium substrate after secondary growth was positioned in the Teflon-lined vessel. The synthetic solution was prepared by dissolving $Na_2EDTA$ (0.20 M), $Ca(NO_3)_2$ (0.20 M), and cetylpyridinium chloride (0.02 M) in 15 ml deionized water sequentially at 40° C. under stirring to form a viscous clear calcium source solution with pH adjusted to 8.0 by ammonium hydroxide. The phosphate source solution with pH ~8.0 was prepared by dissolving $(NH_4)_2HPO_4$ in a second 15 ml container of deionized water. The two solutions were mixed together, forming the synthetic solution for the tertiary hydrothermal deposition. The tertiary growth was carried out for 60 hours at 200° C. and autogenous pressure. To keep sufficient calcium and phosphate ions for HAP film growth during the reaction, the synthetic solution was replaced with fresh solution after every 15 hours until a dense HAP crystalline film was obtained.

Product Characterization

The crystal structure of HAP was determined by X-ray powder diffraction (XRD) with Cu Kα radiation ($\lambda=1.5418$ Å). The integration time was 2 hours and the step size was 0.02 degrees/3 seconds. Images of particle morphology and elemental analysis of the products were obtained using a scanning electron microscope equipped with an energy dispersive x-ray (EDX) spectrometer. The Fourier transform infrared (FTIR) spectrum was recorded with a spectrophotometer in the range of 500-2000 $cm^{-1}$. The sample was measured with 32 scans at an effective resolution of 2 $cm^{-1}$. Proton conductivity measurements of the membranes were carried out using two-point probe alternating current impedance spectroscopy over a frequency range of 300 kHz to 0.1 Hz. The upper surface of the HAP film was sputter coated with ~300 nm of palladium/gold (60/40) alloy as electrode. The electrical platinum leads were attached to both sides of the membrane using platinum paint. The membrane was attached to the end of an alumina tube using ceramic adhesive with the HAP film facing outward. The tube was placed in a tube furnace for temperature control. To avoid palladium embrittlement, nitrogen was fed to the inside of the tube as it was heated. The gas flow was switched to hydrogen when the temperature reached 300° C. The membrane was heated stepwise with a ramp rate of 2° C./minute, with the membrane maintained at constant temperature for at least one hour prior to each conductivity measurement.

Results and Discussion
Seeding HAP on Palladium Membranes

Electrochemical deposition has been widely studied for coating HAP on titanium and titanium alloy substrates in the area of bioactive surface modification for orthopedic implants. Under appropriate synthetic conditions, an applied electric current causes a local increase in pH near the cathode with the formation of OH⁻ n the electrolyte solution due to formation of hydrogen gas by the reduction of $H_2O$. The increased pH and accumulation of both $Ca^{2+}$ and $HPO_4^{2-}$ ions near the cathode result in the supersaturation of calcium phosphate salts in the solution. As a result, HAP nucleation and growth is driven by the supersaturation onto the cathode metal electrode with the c-axis of the crystal preferentially oriented normal to the electrode surface. A reported, typical recipe of electrochemical/hydrothermal synthesis of HAP films on titanium substrates uses constant current conditions of ~12.5 $mA/cm^2$ at temperatures of 100-200° C. for a period of ~1 hour.

The electrochemical deposition of HAP onto a palladium substrate has never been reported and is particularly challenging due to hydrogen embrittlement; i.e., the membrane warping and damage that occurs when pure palladium is exposed to hydrogen at temperatures below 293° C. Since hydrogen gas is evolved at the cathode during electrolysis and HAP grows only on the cathode, the HAP can not be electrochemically deposited without exposing the palladium membrane directly to hydrogen gas. Under typical synthetic growth conditions of HAP on a titanium substrate, palladium-based membranes are destroyed by hydrogen embrittlement. To minimize hydrogen embrittlement, a reduction in hydrogen production was obtained by applying a smaller electrical current (typically less than 10 $mA/cm^2$) and/or a shorter deposition time (less than 5 minutes), allowing the growth of an acceptable seed layer on the palladium substrate.

Figure 6:
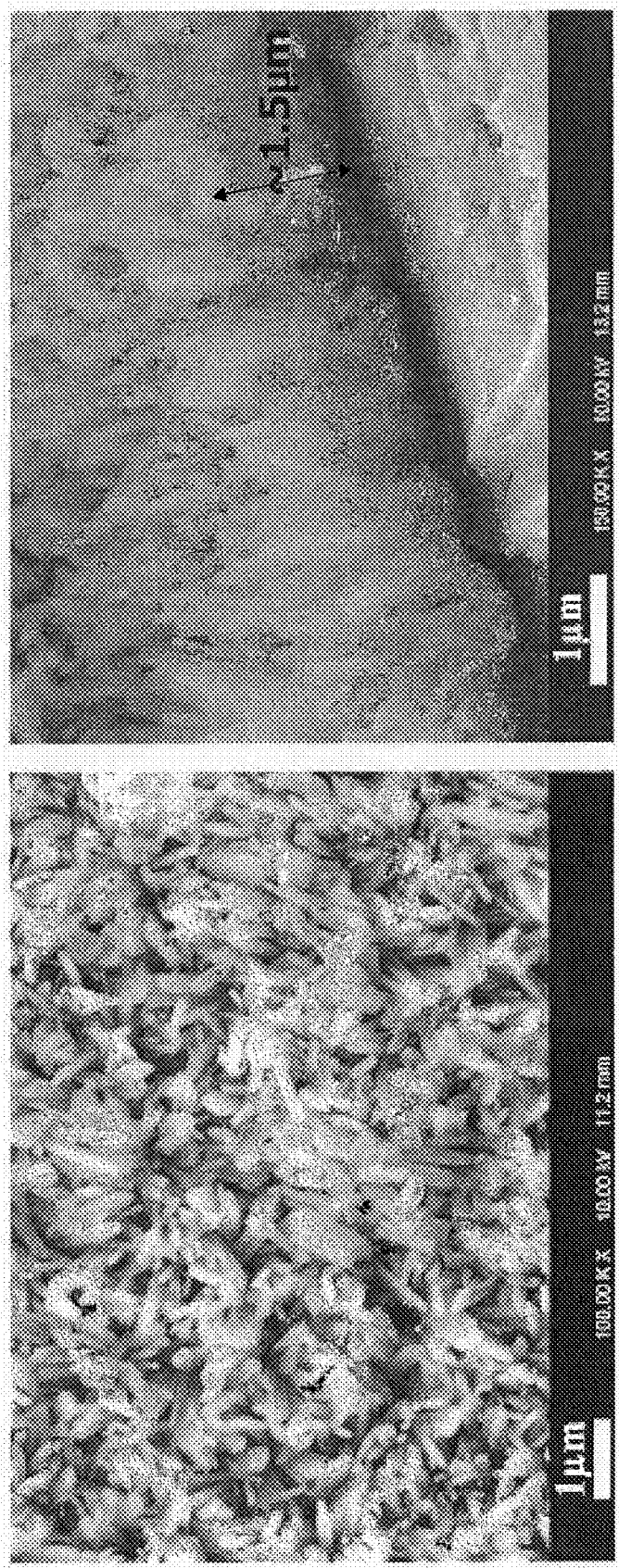
FIG. 6a is a top-view SEM image.
FIG. 6b is a side-view SEM image, showing HAP seeds grown on Pd membrane, according to an illustrative embodiment of the invention.

FIGS. 6(a, b) show an HAP seed layer with a porous structure on the underlying palladium substrate formed in 4 minutes at 95° C. with a current density of 9.5 $mA/cm^2$. The crystals in the seed layer typically have platelet morphology with a length of about 1-2 microns and a submicron width, as shown in FIG. 6(a). FIG. 6(b) indicates that the crystals preferentially orient normal to the palladium substrate. The X-ray diffraction pattern in FIG. 10(b) identifies the crystals as HAP, formed most likely from the plate-like octacalcium phosphate, a crystal phase that typically appears at low pH and within a certain temperature range in the electrochemical deposition of HAP. The strongest diffraction peak in FIG. 10(b) corresponds to (002) plane of the crystals, which demonstrates a (002) (i.e., c-axis) preferred orientation normal to the palladium substrate. Some HAP crystals also orient along other directions as indicated by the presence of several other diffraction peaks in FIG. 10(b). Typically, in a hexagonal HAP crystal, the cross-sectional surface, which is hexagonal in shape, is the c surface, which is parallel to the a-axis of the crystal unit cell. The six surfaces (rectangular in shape) occurring along the c-axis of the crystal unit cell are a surfaces (see FIG. 2a). The HAP seed layer promotes adhesion of the seed crystals to the underlying substrate and enhances secondary and tertiary growth of oriented HAP films at the substrate surface.

HAP Secondary Hydrothermal Growth

Hydrothermal synthesis with a mechanism of calcium chelate decomposition has been studied to grow large sized HAP crystals. A chelating agent, usually a carboxylic acid such as acetic acid, lactic acid, citric acid, and ethylenediamine tetraacetic acid (EDTA), is used to bind calcium ions to form a homogeneous phosphate-containing solution for the reaction. Upon heating the solution, the calcium carboxylate decomposes as the chemical equilibria shift and calcium is slowly and continuously released into the phosphate-containing solution. As the solution becomes supersaturated, calcium phosphate crystals progressively nucleate and grow. In other words, the crystal nucleation and growth are mediated with a controlled supersaturation by calcium chelating decomposition. Without the chelating agent, the solution would be supersaturated and the most stable calcium phosphate phase would spontaneously precipitate at the beginning of the reaction.

Figure 7:
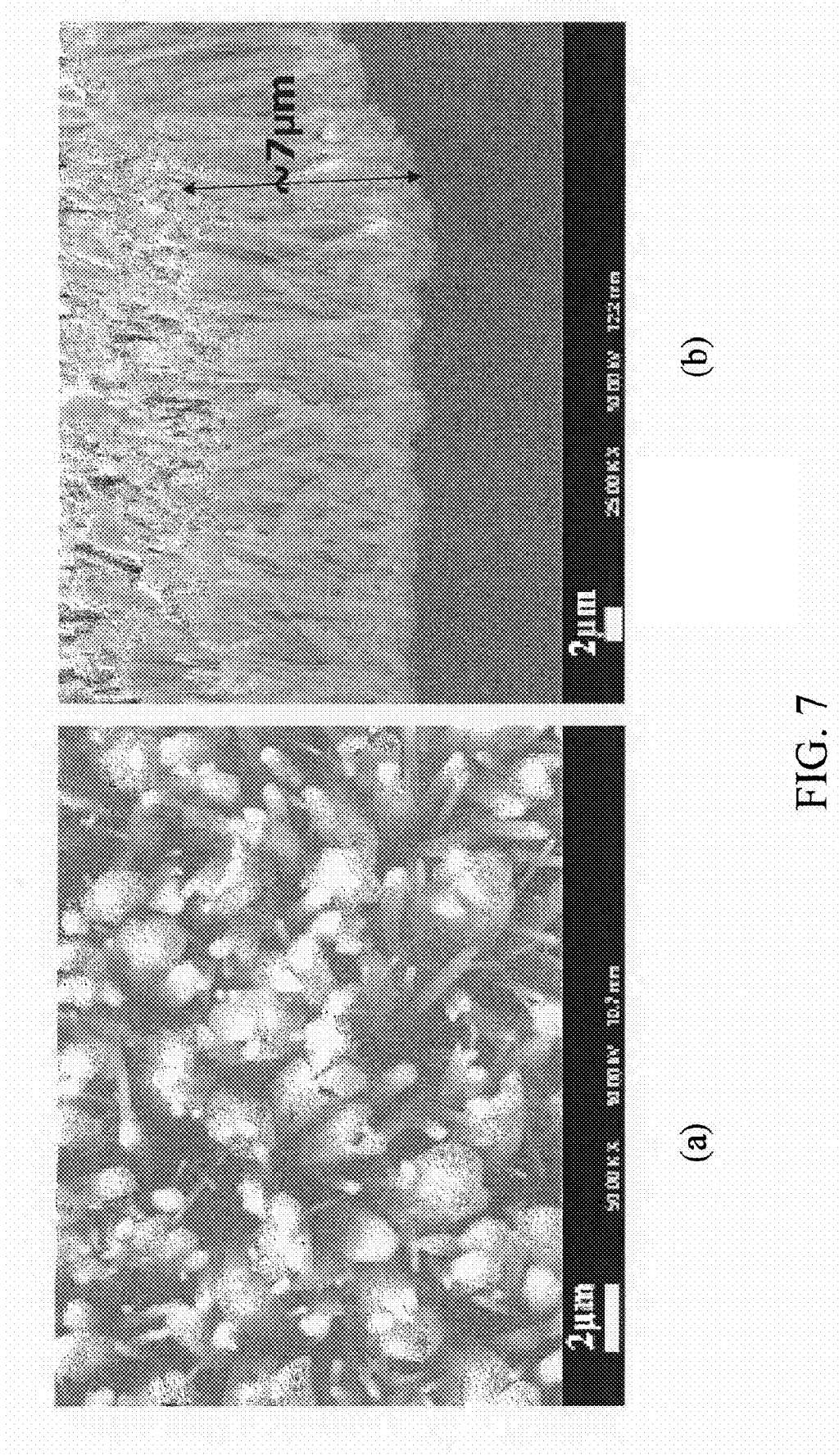
FIG. 7a is a top-view SEM image of secondary growth of HAP crystals on a Pd membrane.
FIG. 7b is a side-view SEM image of FIG. 7a, according to an illustrative embodiment of the invention.
Figure 10:
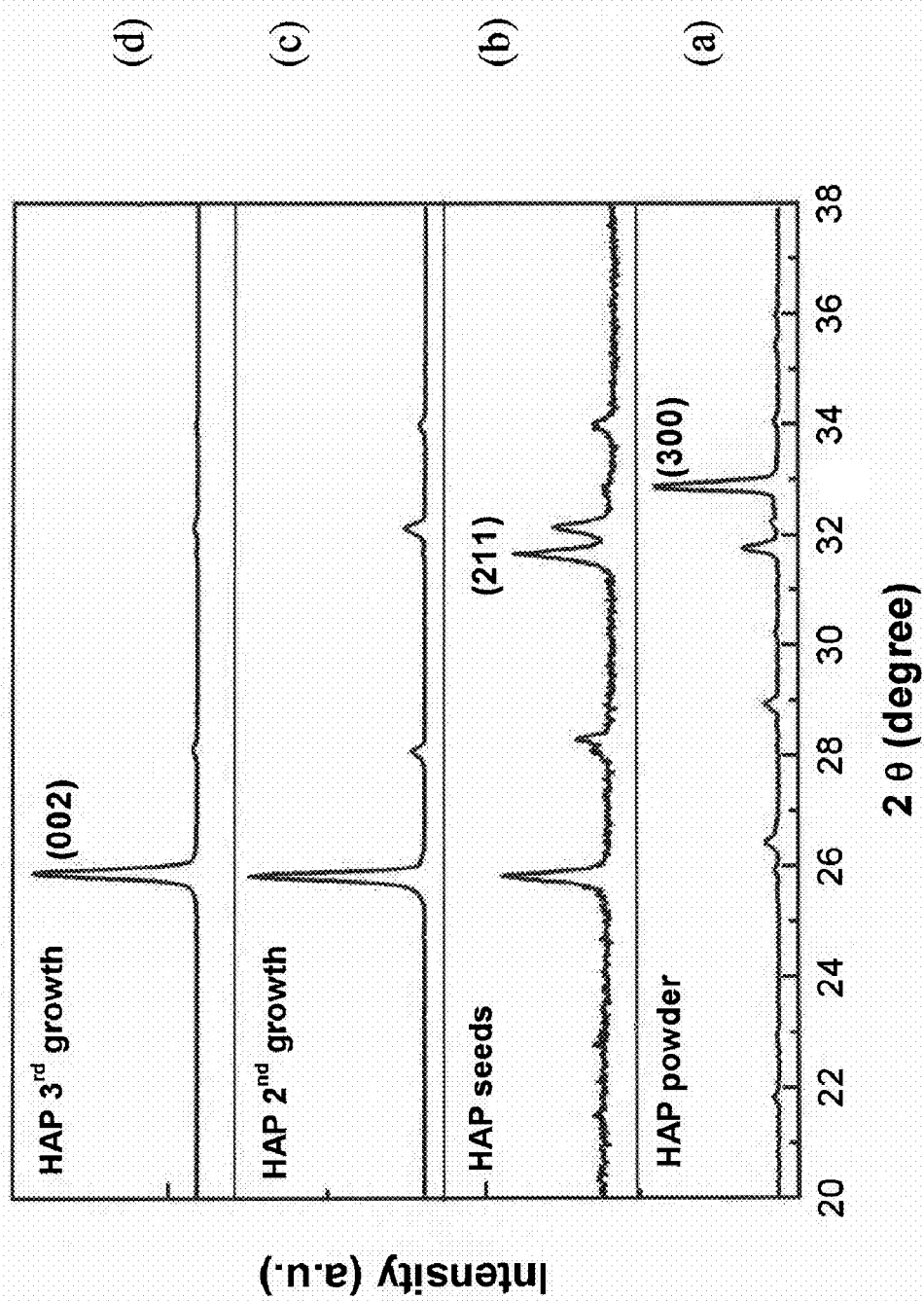
FIGS. 10(a-d) are X-ray diffraction (XRD) patterns of HAP seed and film layers in various growth processes, according to an illustrative embodiment of the invention.

FIGS. 7(a, b) and FIG. 10(c) show the surface and cross-sectional morphology, and XRD pattern, respectively, of an HAP crystal layer grown on a seeded palladium substrate after a secondary hydrothermal deposition in a calcium-$Na_2$EDTA chelating solution. In FIG. 7(a), most crystals are rod-like in shape, having a well-defined hexagonal crystal habit with a width up to approximately 2 μm. The rod-shaped crystals orient perpendicular all the way down to the substrate with a length of approximately 7 m, as shown in FIG. 7(b). The XRD pattern of the HAP film, illustrated in FIG. 10(c), shows a strong enhancement in intensity of (002) diffraction peak in comparison with shrinkage or disappearance of other diffraction peaks. The enhanced (002) intensity indicates that HAP crystals are c-axis oriented normal to the palladium substrate, consistent with the SEM observation in FIG. 7(b). The hexagonal surface is the c-surface of the crystals, as visualized in the top-view SEM image in FIG. 7(a). The six a-surfaces situating along the c-axis perpendicular to the c-surface of the crystals can be visualized in the side-view SEM image in FIG. 7(b).

The morphology and orientation of HAP crystals developed in the secondary hydrothermal growth are similar to those prepared by the hydrothermal-electrochemical deposition for a long deposition time on titanium substrates. The damage of palladium membrane due to hydrogen embrittlement, as discussed in HAP seeding step, prevents growth of large HAP crystals with a purely electrochemical deposition process. The hydrothermal synthesis with a calcium chelate decomposition controls HAP supersaturation and promotes HAP growth with aligned c-axes on the seeded substrate surface rather than in the phosphate-containing solution. The seeded surface is important for the further growth of HAP into a denser crystalline film. A control experiment using unseeded palladium substrate was performed to investigate the effect of the seed layer. After the reaction, no uniform deposition was achieved, and only a few crystal aggregates consisting of rod-like HAP crystals are deposited as widely separated islands on the surface of the substrate.

HAP Tertiary Hydrothermal Growth

Secondary hydrothermal growth of the seed layer (FIG. 7) yielded desired, highly c-axis-oriented rod-like crystals, but did not result in a dense HAP film. A tertiary growth step was used to promote lateral intergrowth of crystals to achieve a gas-tight HAP thin film. Synthesis of HAP has shown that HAP tends to form elongated whiskers along the c-axis of the crystal with well developed a-surfaces. Accelerating HAP growth along the a-axis direction (i.e., perpendicular to the c-axis) with developed c-surfaces results in crystals forming a dense, gas-tight thin film. Studies of HAP as a liquid chromatography packing indicate that HAP crystals have positively-charged a-surfaces and negatively-charged c-surfaces. The addition of oppositely-charged additives such as surfactants may result in electrostatic adsorption of molecules onto specific a- or c-surfaces to slow down or inhibit the crystal growth along one specific direction by mediating the crystal growth kinetics. To alter HAP growth preferentially along the a-axis direction, the cationic surfactant cetylpyridinium chloride was added in a tertiary hydrothermal growth of the HAP film.

FIGS. 8(a, b), and FIG. 10(d) show the morphology and XRD pattern, respectively, of an HAP film grown on the crystal layer by a tertiary hydrothermal growth. The HAP film appears as a dense and strongly adherent layer on the substrate. FIG. 8(a) is a top-view of the film that shows the crystal domains grown together over several microns, although some small gaps remain. The small gaps do not extend completely throughout (i.e., to the bottom of) the film, as visualized in the side-view SEM image in FIG. 8(b). The crystal film is oriented normal to the palladium substrate with a thickness of approximately 25 μm. The crystals in the film appear larger both in width and length than those after secondary growth, which indicates that HAP crystallization occurs along not only the a-axis direction, but also the c-axis direction in the tertiary deposition step. The rate of crystal growth in the a-axis direction is increased, while decreased in the c-axis direction, to form a dense, gas-tight film in the tertiary step. The crystal c-axis orientation is further verified with XRD characterization, as shown in FIG. 10(d). The peak corresponds to the (002) reflection plane. This confirms that during the tertiary treatment, HAP crystal growth follows the orientation of the original plate-like seeds in the seeding step and rod-like crystals in the secondary step, while the growth of mis-oriented crystals is minimal or nonexistent in the tertiary hydrothermal deposition.

Figure 9:
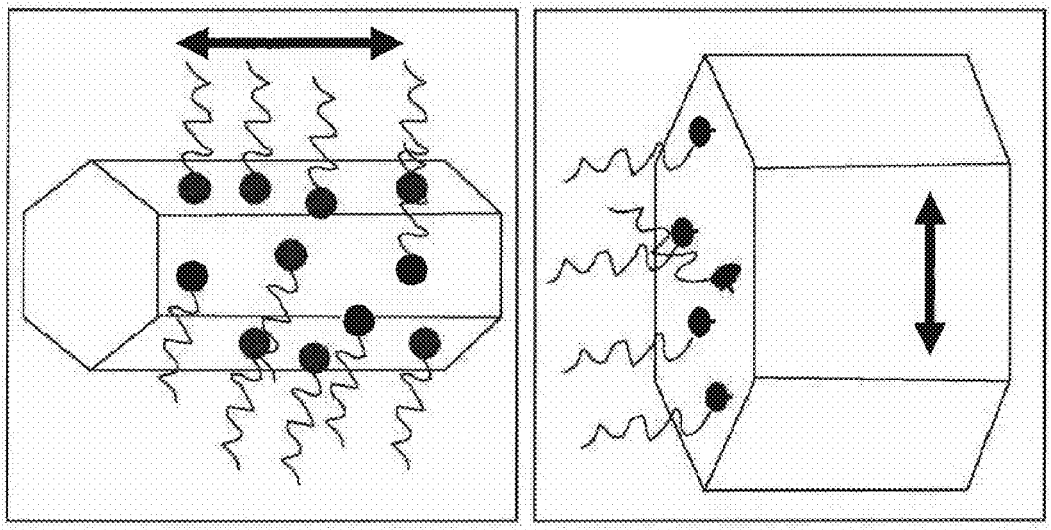
FIG. 9 schematically illustrates how surfactants assist HAP growth along preferential c- or a-axis directions, according to an illustrative embodiment of the invention.
Figure 9:
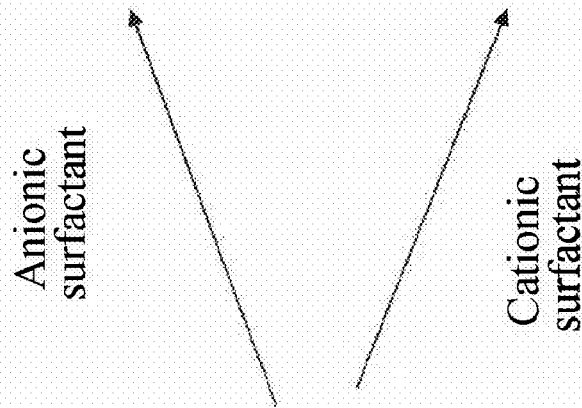
Figure 9:
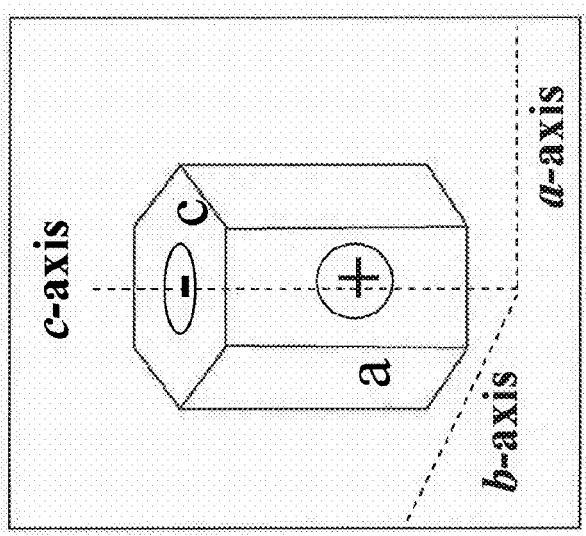

The foregoing SEM and XRD characterizations indicate that HAP crystals grow together with c-axes normal to the underlying palladium substrate. Cationic cetylpyridinium chloride most likely functions to assist crystal growth along a-axes. As schematically illustrated in FIG. 9, the positively charged surfactant is preferentially adsorbed to the negatively charged c-surfaces through electrostatic interactions. The adsorbed surfactant limits diffusion of the calcium and phosphate ions onto the c-surfaces to slow down growth along the c-axis direction. As a result, sufficient calcium and phosphate ions diffuse to the a-surfaces to accelerate growth along the a-axis direction, and finally to grow crystals together. To further verify the effect of cetylpyridinium chloride on the crystal growth, a control experiment to synthesize HAP film under the same conditions without addition of cetylpyridinium chloride was conducted. The result shows that individual crystals in the film grew longer than 25 microns, but many gaps between crystals were observed to extend down to the bottom of the film.

Figure 11:
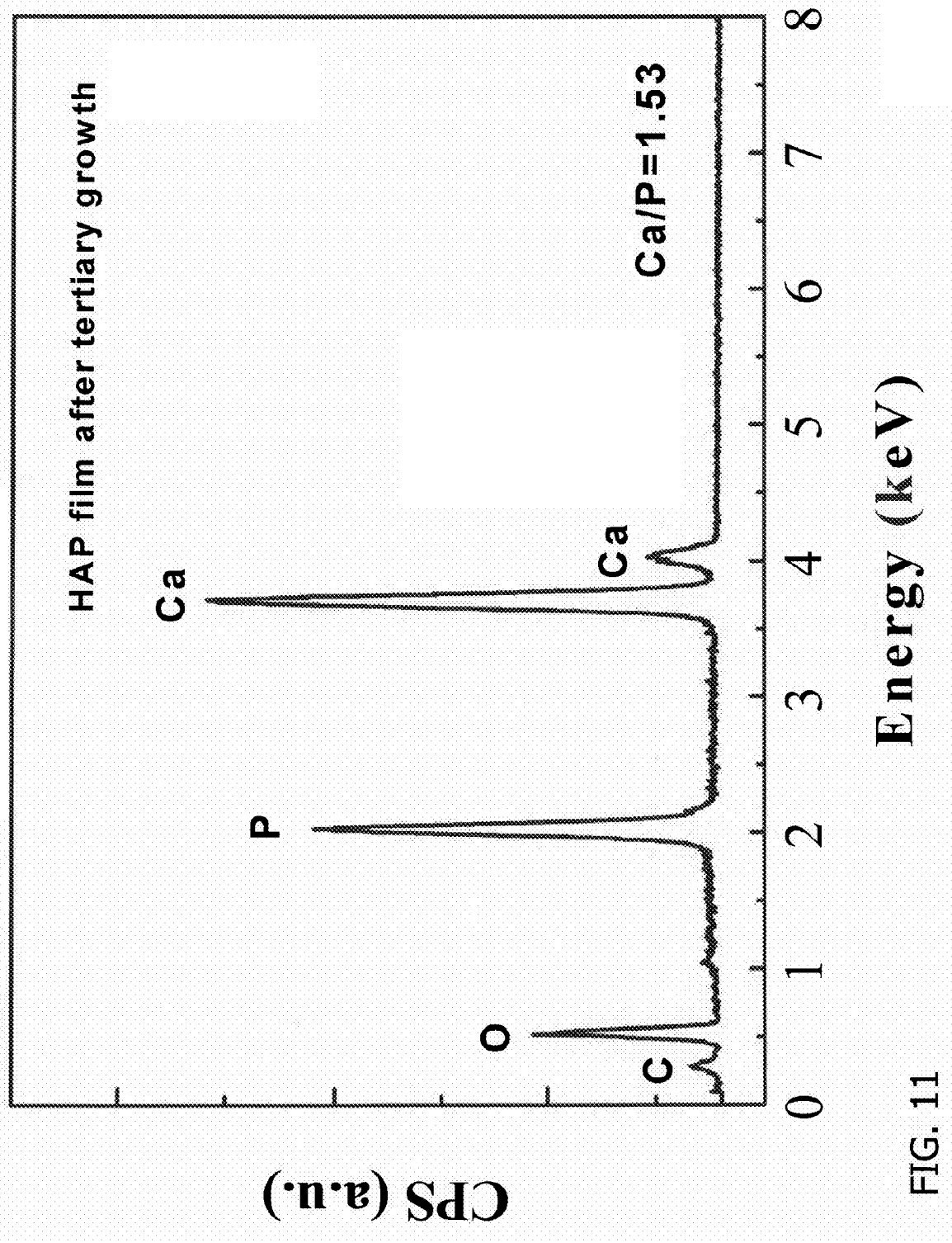
FIG. 11 shows an EDX spectrum of HAP film on a palladium substrate after tertiary hydrothermal growth, according to an illustrative aspect of the invention.
Figure 12:
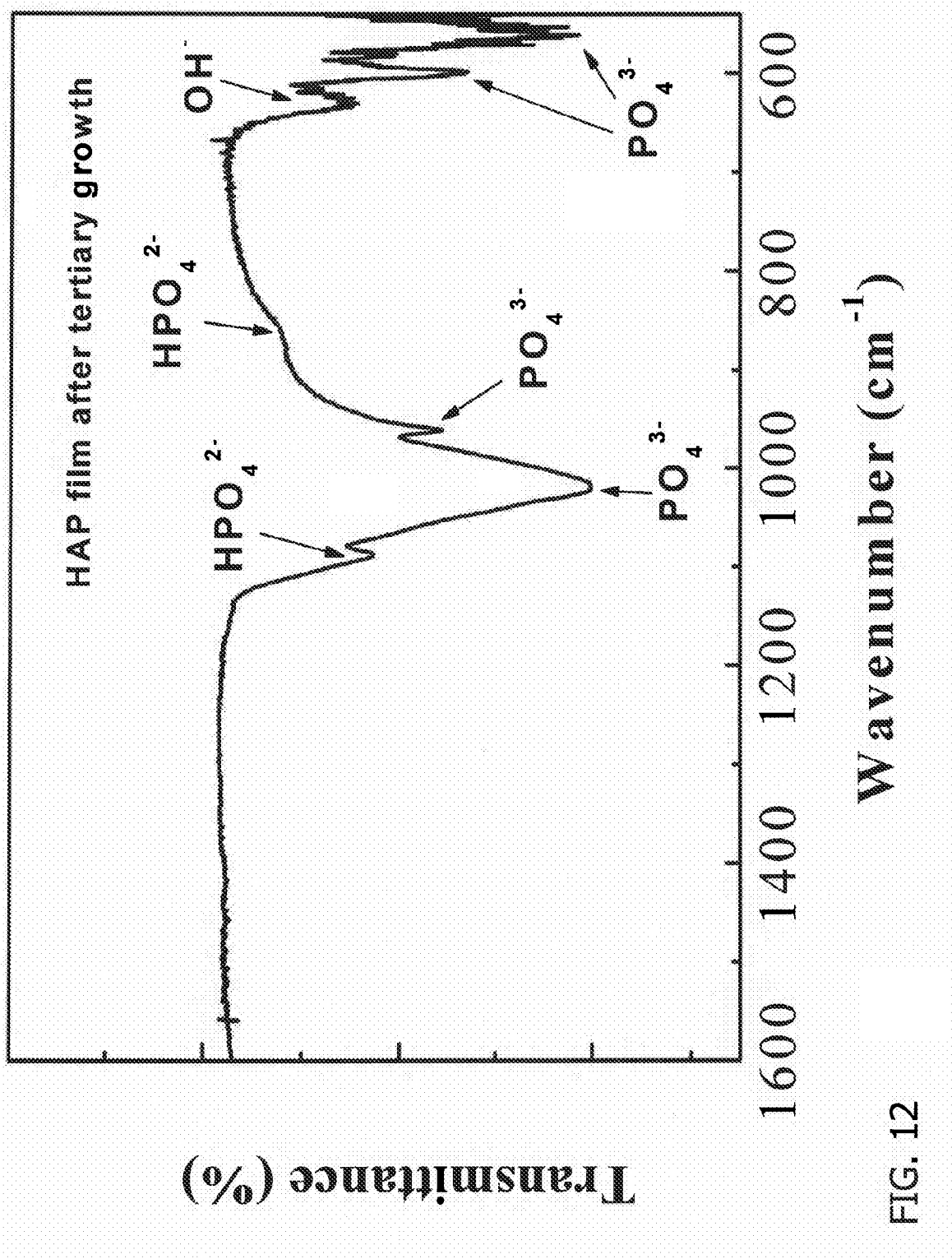
FIG. 12 shows an FTIR spectrum of HAP film on a palladium substrate after tertiary hydrothermal growth, according to an illustrative aspect of the invention.

The elemental composition and Ca/P ratio of the HAP films were studied with EDX spectroscopy, as shown in FIG. 11. The EDX spectrum is comprised of O, P and Ca peaks, confirming the presence of HAP. The C peak is likely from carbon tape used for the SEM observation. A semi-quantitative analysis of the EDX spectrum shows that the Ca/P atomic ratio is around 1.53, a little lower than the ideal stoichiometric value of 1.67. The nonstoichimetry (Ca deficiency) of HAP is consistent with reports from the literature for synthesis of micro-sized HAP crystals in hydrothermal reactions. The FTIR spectrum of the HAP film illustrated in FIG. 12 shows all absorption bands characteristic for HAP. The librational vibration of $OH^-$ groups appear at 632 $cm^{-1}$, whereas the internal modes corresponding to the $PO_4^{3-}$ groups centered at a range of wavenumbers can be clearly determined from the spectrum. Absence of any distinct bands in the range of 1400-1500 $cm^{-1}$ indicates that HAP does not contain large quantities of carbonate ions. The band observed at 870 $cm^{-1}$ is ascribed to the $HPO_4^{2-}$ groups, in agreement with data reported in the literature. The presence of $HPO_4^{2-}$ groups is consistent with the low Ca/P ratio in the synthesized HAP crystalline films.

HAP Films with Tunable Thickness

To make an effectively working fuel cell, a thin electrolyte membrane will advantageously reduce the membrane resistance. A typical thickness of the HAP membranes after the seeded growth is about 25 μm. A fuel cell HAP membrane film thickness will advantageously be less than 25 μm. According to an embodiment of the invention, membrane thickness can be reduced by using a shorter deposition time in the seed layer formation and/or a higher molar ratio of calcium to phosphate (or, lower phosphate concentration) in the hydrothermal depositions.

Figure 14:
FIGS. 14(a, b) show top and bottom SEM images, respectively, of the surfaces of the HAP thin film shown in FIG. 13d, according to an illustrative aspect of the invention.

FIGS. 13(a-d) show SEM images of HAP seed layers on a palladium substrate prepared by electrochemical deposition at 9.5 $mA/cm^2$ current density in (a) 2 minutes and (b) 1 minute; (c) and (d) showing the morphology of HAP films after tertiary hydrothermal synthesis grown from the seed layer (a) and (b), respectively. As shown in FIGS. 13(a, b), the seed layer is about 300 nm and 600 nm thick when the electrochemical deposition time was 2 and 1 minutes, respectively. The secondary and tertiary hydrothermal synthesis using these two seeded surfaces occurred under conditions similar to grow approximately 25 μm thick films, except the phosphate concentration was reduced to 0.01 M from the original phosphate concentration of 0.06 M. After the reaction, the synthesized films were reduced to 5 and 2.5 μm thick, respectively, as shown in FIG. 13(c, d). The reduced film thickness is partially due to the thin seed layers produced in the electrochemical deposition. The reduced phosphate concentration may lower the degree of supersaturation of HAP in the reaction, and as a result alter the crystal growth habit by slowing down the crystal growth along the c-axis, and promoting the growth along the a-axis into a dense thin film. The HAP thin films still have a dense and continuous morphology on the surfaces of the approximately 2.5 μm thick films, as shown in FIG. 14. The top surface (FIG. 14a) indicates that there are some crystal domains, but all of them are grown together into a dense film. The bottom surface (FIG. 14b) is smooth and dense. A few small protrusions in the bottom surface result from the palladium substrate because the electroless-plated substrate is not perfectly flat and smooth.

Proton Conductivity of HAP Films

Figure 15:
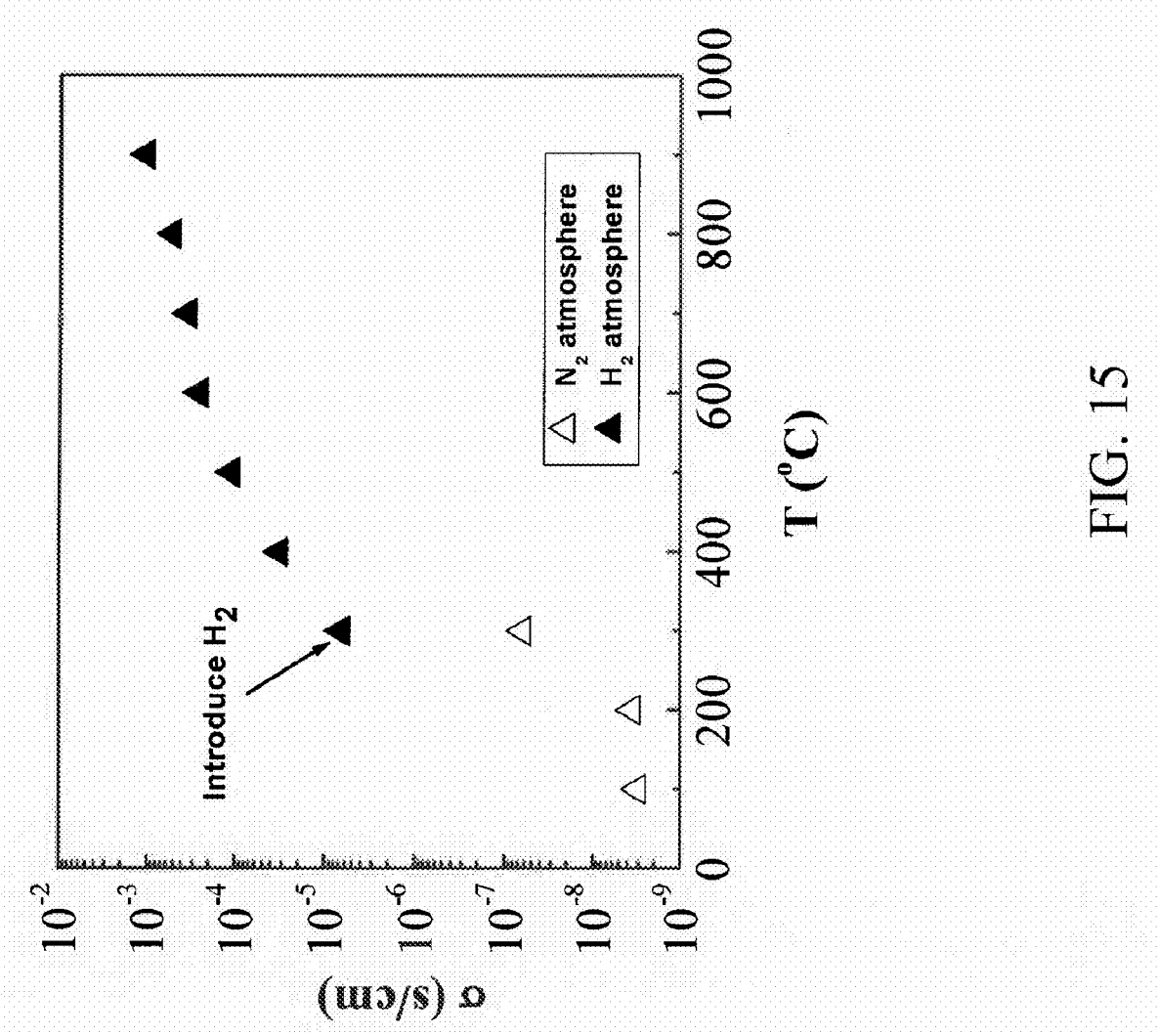
FIG. 15 graphically shows measured proton conductivity (σ) of an HAP film, according to an illustrative aspect of the invention.

FIG. 15 shows proton conductivity of an HAP thin film on a palladium substrate prepared by the electrochemical and hydrothermal deposition processes described herein above. Electrical impedance spectroscopy was carried out to characterize the proton conductivity of the films. The measurement was conducted on an HAP film approximately 25 μm thick, similar to that shown in FIG. 8, created after seeded hydrothermal growth. FIG. 15 shows the resulting proton conductivity as a function of temperature up to 900° C. At 100-200° C., the measured conductivity was very low, approximately $10^{-9}$ S/cm. At 300° C., the conductivity was approximately $10^{-7}$ S/cm while nitrogen was being fed to the tube. The conductivity jumped to approximately $10^{-5}$ S/cm at 300° C. after switching to hydrogen flow into the tube. The enhancement of proton conductivity at 300° C. when the membrane was exposed to a hydrogen atmosphere is due to the injection of protons from the palladium membrane to the HAP thin film. The injected protons increase the number of transporting protons in the crystalline membrane and, as a result, improve the membrane proton conductivity. The conductivity increased steadily with temperature above 300° C., reaching approximately $10^{-3}$ S/cm at 800° C., due to the c-axis-aligned crystal domains (it should be noted that interfacial resistance between the electrodes and the HAP may give a non-negligible contribution to the overall measured resistance because the film thickness is small (~25 μm)). In comparison, a traditional sintered HAP ceramic in dry air at 800° C. has a conductivity of approximately $5 \times 10^{-7}$ S/cm, nearly four orders of magnitude lower, suggesting that the HAP membrane with aligned crystal domains according to an embodiment of the invention may be capable of giving improved fuel cell performance.

Conductivity may further be increased by a) yttrium and b) fluorine substitution.

Synthesis and SEM characterization of yttrium substituted hydroxyapatite (Y-HAP)

Preparation of Electrolyte

The electrolyte was prepared by adding 125 ml 50 mM tris(hydroxyl)aminomethane (Tris) (99.8+%, ACS reagent, Aldrich) into a 250 ml beaker, followed by adding 1.006 g sodium chloride (NaCl) (99+%, ACS reagent, Aldrich), 0.046 g calcium chloride dihydrate ($CaCl_2 \cdot 2H_2O$) (99+%, ACS reagent, Aldrich), and 0.037 g potassium hydrogen phosphate ($K_2HPO_4$) (99.99%, Aldrich)) in sequence. The solution changed from clear to opaque after $K_2HPO_4$ was introduced. The pH of the solution was 9.78. An adequate amount of HCl (38%, Mallinckrodt Chemicals) was used to titrate the solution to a pH of 7.20. The solution returned to clear after the titration process.

Electrochemical Deposition of HAP

The beaker containing the electrolyte was transferred to a preheated oil bath. After approximately 1 hour, the electrolyte temperature was stabilized at 95° C. A constant electric current was applied using a DC power supply. The current density was set to 25.0 mA/cm² (based on the area of the Pd cathode) for 4 min. A magnetically coupled stir bar turning at 600 rpm was utilized to stir the bath throughout the deposition process. After the electrochemical deposition of hydroxyapatite, the cathode electrode was taken out of the electrolyte, rinsed with deionized water several times and dried in air. The resulting HAP film on the cathode was used as the seed layer for the post-growth (secondary and tertiary growth) of HAP in hydrothermal synthesis.

Secondary Growth

The synthetic solution was prepared by dissolving $Ca(NO_3)_2$, $Y(NO_3)_3$ and $Na_2EDTA$ in 15 ml deionized water, and $(NH_4)_2HPO_4$ was dissolved in the other 15 ml deionized water under a mild magnetic stirring. The two solutions were then mixed together after the pH was raised to 10 with approximately 28% ammonium hydroxide, respectively. The final aqueous solution contained 0.10 M $Ca(NO_3)_2$, 0.02 M $Y(NO_3)_3$, 0.13 M $Na_2$-EDTA and 0.06 M $(NH_4)_2HPO_4$. The solution was transferred into a 40 ml Teflon liner situated in a stainless steel autoclave. The HAP seeded electrode was fixed onto a Teflon plate and placed inside the synthetic gel with the seeded side facing down to the bottom of the Teflon liner. The autoclave was closed tightly and moved into a preheated gravity convection oven at 200° C. for 15 hours. After the reaction, the autoclave was cooled to room temperature in a fume hood. The sample was taken out, rinsed with deionized water several times, and dried in air.

Scanning Electron Microscopy

Figure 16:
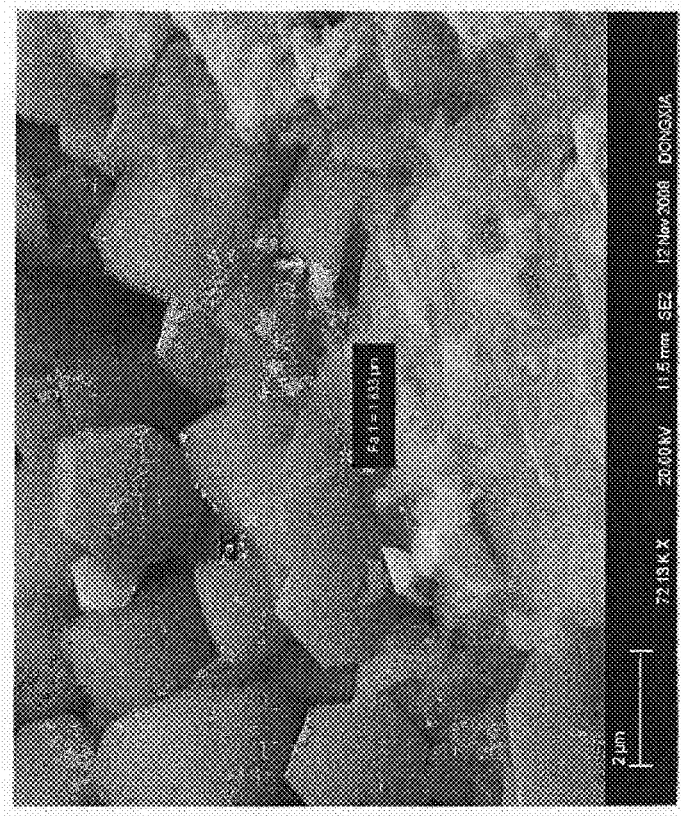
FIGS. 16a, b show a SEM top-view image and a side-view image, respectively, of a Yttrium-substituted HAP film produced by seeded hydrothermal growth according to an embodiment of the invention.
Figure 16:
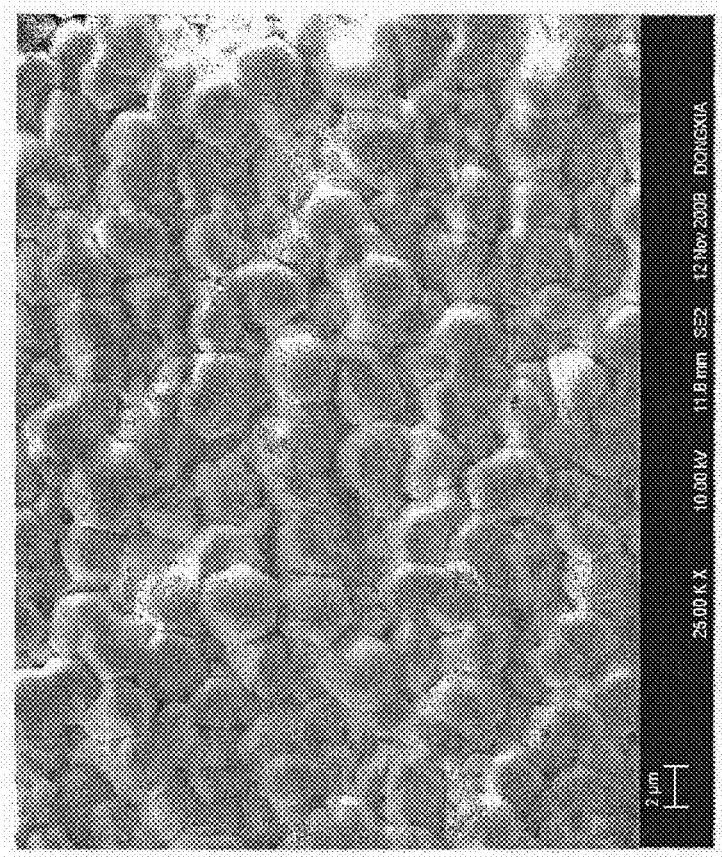

Images of crystalline HAP films were taken with a scanning electron microscope at an accelerating voltage of 10 kV. FIGS. 16a, b show a top-view image and a side-view image, respectively, of Y-HAP films produced by seeded hydrothermal growth according to an embodiment of the invention.

Yttrium nitrate can be added along with calcium nitrate during hydrothermal synthesis to obtain crystalline films with varying levels of yttrium substitution.

Synthesis and SEM characterization of fluorine substituted hydroxyapatite (F-HAP)

Preparation of Electrolyte

This was the same as for the synthesis of yttrium substituted hydroxyapatite, above.

Electrochemical Deposition of HAP

This was the same as for the synthesis of yttrium substituted hydroxyapatite, above.

Secondary Growth

A synthetic solution was prepared by dissolving $Ca(NO_3)_2$ and $Na_2EDTA$ in 15 ml deionized water; and $NH_4F$ and $(NH_4)_2HPO_4$ in the other 15 ml deionized water under a mild magnetic stirring. The two solutions were then mixed together after pH was raised to 10 with approximately 28% ammonium hydroxide, respectively. The final aqueous solution contained 0.10 M $Ca(NO_3)_2$, 0.10 M $Na_2$-EDTA, 0.01 M $NH_4F$ and 0.01 M $(NH_4)_2HPO_4$. The solution was transferred into a 40 ml Teflon liner, situated in a stainless steel autoclave. The HAP seeded electrode was fixed onto a Teflon plate and placed inside the synthetic gel with the seeded side facing down to the bottom of the Teflon liner. The autoclave was closed tightly and moved into a preheated gravity convection oven at 200° C. for 15 hours. After the reaction, the autoclave was cooled to room temperature in a fume hood. The sample was taken out, rinsed with deionized water several times, and dried in air.

Tertiary Growth

The synthetic solution was the same as that in secondary growth except that cetylpyridium chloride (0.01 M) was added in the reactant solution. All experimental procedures were the same as those used for secondary growth.

Scanning Electron Microscopy

Figure 17:
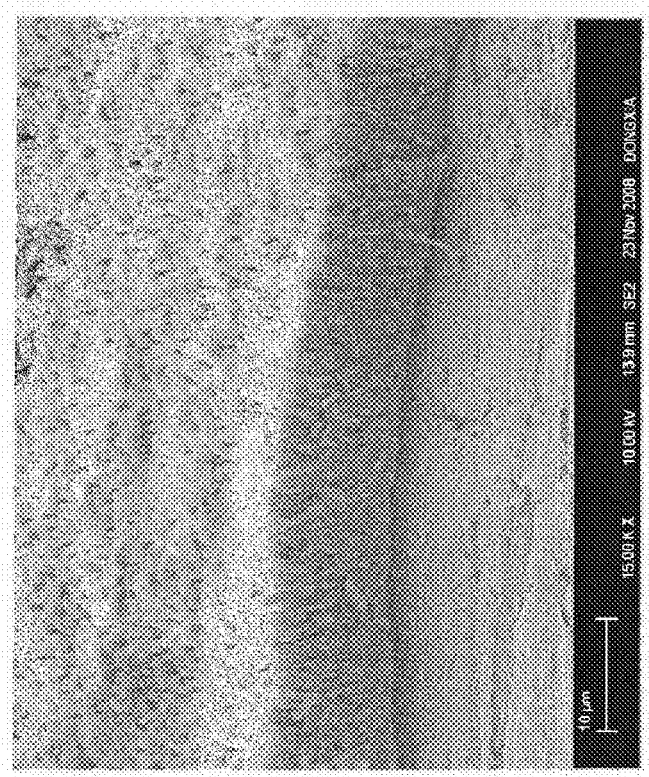
FIGS. 17a, b show a SEM top-view image and a side-view image, respectively, of a Fluorine-substituted HAP film produced by seeded hydrothermal growth according to an embodiment of the invention.
Figure 17:
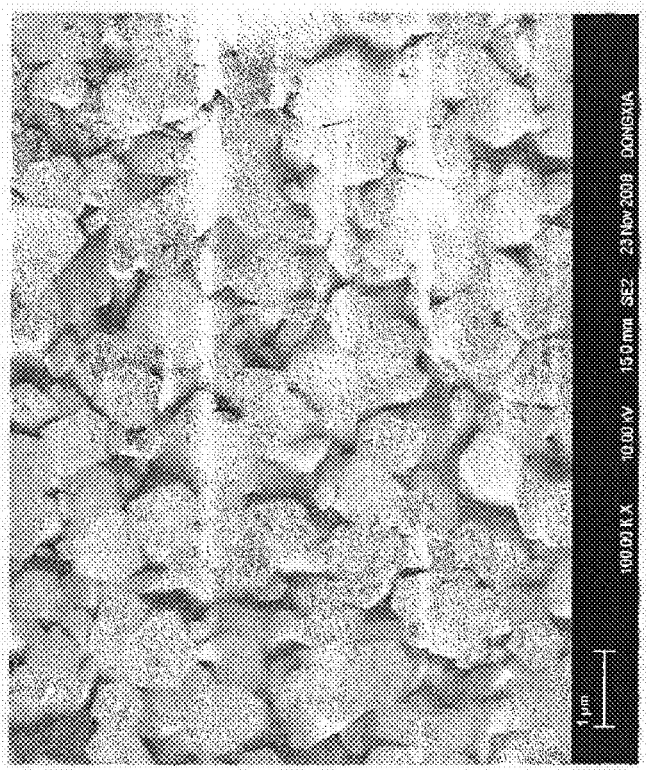

Images of crystalline HAP films were taken with a scanning electron microscope at an accelerating voltage of 10 kV. FIGS. 17a, b show a top-view image and a side-view image, respectively, of F-HAP films produced by seeded hydrothermal growth according to an embodiment of the invention.

Comparative Fuel Cell Performance

Figure 19:
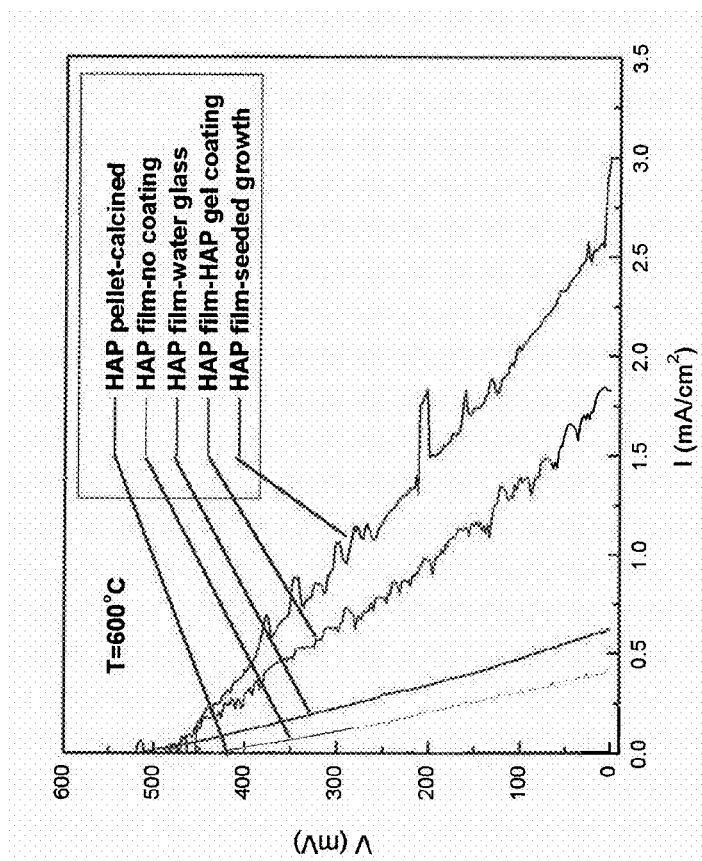
FIG. 19 graphically shows comparative fuel cell performance at 600° C. measured on HAP pellet and films prepared by different approaches (limiting current density from low to high: HAP sintered pellet (at 1000° C. for 10 hours); HAP films produced by electrochemical deposition; HAP films produced by electrochemical deposition with water glass coated gaps between crystals; HAP films produced by electrochemical deposition with HAP gel-coated gaps between crystals; HAP films by seeded hydrothermal growth.
Figure 18:
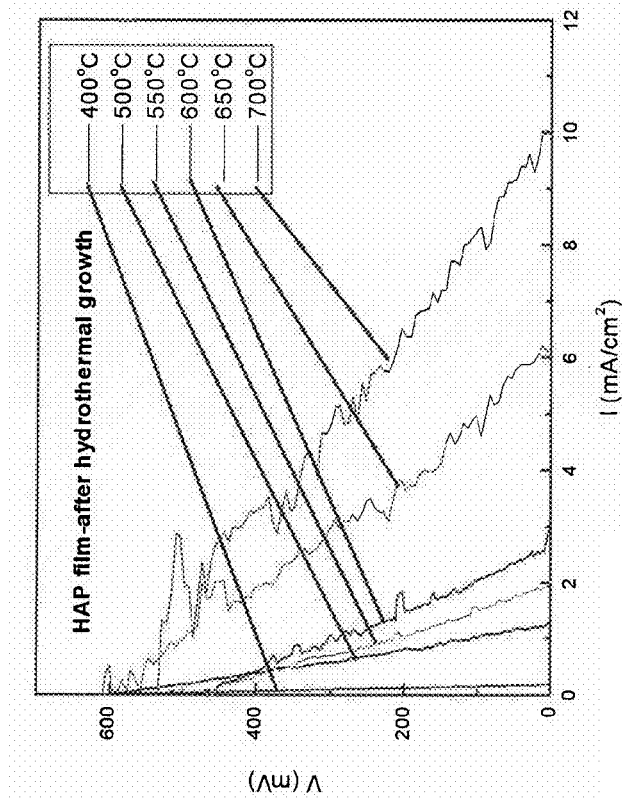
FIG. 18 graphically shows comparative fuel cell performance under different temperatures measured on HAP films by seeded hydrothermal growth, according to an illustrative aspect of the invention.

FIG. 18 graphically shows comparative fuel cell performance under different temperatures measured on HAP films by seeded hydrothermal growth, according to an illustrative aspect of the invention. Assembly of the test-cell was completed as follows: the cathode catalyst was prepared by sintering BSCF/PEG slurry at 950° C. for 1 hour to form a porous pellet. A platinum (Pt) paste was coated to the porous pellet by brush-coating and sintering at 900° C. for 0.5 hour. The cathode BSCF/Pt pellet was attached to the HAP membrane and a Pt mesh was attached to the cathode as a current collector. Current and potential leads were similarly attached to the anode (Pd foil) and cathode (Pt mesh) for the performance measurement. The test-cell was then seated across the top of an alumina tube using ceramic adhesive with the cathode facing outward. The alumina tube was placed in a tube furnace for temperature control. A similar procedure to the HAP conductivity measurement was used here to measure the fuel cell performance FIG. 19 graphically shows comparative fuel cell performance at 600° C. measured on HAP pellet and films prepared by different approaches (limiting current density from low to high: HAP sintered pellet (at 1000° C. for 10 hours); HAP films produced by electrochemical deposition; HAP films produced by electrochemical deposition with water glass coated gaps between crystals; HAP films produced by electrochemical deposition with HAP gel-coated gaps between crystals; HAP films by seeded hydrothermal growth.

In summary, c-axis oriented HAP thin films synthesized by seeded growth on a palladium hydrogen membrane substrate have been disclosed. An exemplary synthetic process included electrochemical seeding on the substrate, and secondary and tertiary hydrothermal treatments under conditions that favor growth along c-axis and a-axis in sequence. By adjusting corresponding synthetic conditions, an HAP this film can be grown to a controllable thickness with a dense coverage on the underlying substrate. Proton conductivity measurement showed that the thin films have relatively high conductivity under hydrogen atmosphere and high temperature conditions. The c-axis oriented films obtained by the embodied technique may be integrated into fuel cells for application in the intermediate temperature range of 200-600° C. The electrochemical-hydrothermal deposition technique disclosed herein may be applied to create other oriented crystal materials having optimized properties, useful for separations and catalysis as well as electronic and electrochemical applications, electrochemical membrane reactors, and in chemical sensors.

Having thus described the various embodiments of the invention, it will be apparent to those skilled in the art that the foregoing detailed disclosure is presented by way of example only and thus is not limiting. Various alterations, improvements and modifications recognized by those skilled in the art, though not expressly stated herein, may be made and are intended to be within the spirit and scope of the claimed invention.

Additionally, the recited order of processing elements or sequences, or the use of numbers, letters, or other designations, is not intended to limit the claimed processes to any order except as may be specified in the claims. Accordingly, embodiments of the invention are limited only by the following claims and equivalents thereto.

We claim:

1. An ion and/or proton conducting membrane, comprising:
   a crystalline ion-conducting thin film having a thickness t, wherein the thin film is characterized by a plurality of single apatite crystals each having a c-axis orientation normal to the surface of the membrane and having substantially no mis-oriented crystals, further wherein the thin film is in the form of a gas-tight film, further wherein each of the single crystals has a crystal domain that substantially spans the film thickness t.

2. The ion/proton conducting membrane of claim 1, wherein the membrane has a proton conductivity equal to or greater than 1E-6 Siemens per centimeter over a temperature range between about 300° C. to 900° C.

3. The ion/proton conducting membrane of claim 1, wherein the crystalline ion-conducting thin film is hydroxyapatite (HAP).

4. The ion/proton conducting membrane of claim 3, wherein the film thickness is in a range between about 2 micron to 30 micron.

5. The ion/proton conducting membrane of claim 3, wherein the film thickness is in a range between greater than zero to 10 micron.

6. The ion/proton conducting membrane of claim 5, wherein the film thickness, t, is in a range 5 micron <t <2 microns.

7. The ion/proton conducting membrane of claim 3, wherein the single HAP crystals are substantially rod-shaped.

8. The ion/proton conducting membrane of claim 3, wherein the HAP thin film is substantially free of grain boundaries across the thickness t.

9. The ion/proton conducting membrane of claim 3, wherein the HAP thin film further comprises a sol-gel coating of HAP.

10. The ion/proton conducting membrane of claim 1, wherein the thin film is yttrium-substituted HAP.

11. The ion/proton conducting membrane of claim 1, wherein the thin film is fluorine-substituted HAP.

12. The ion/proton conducting membrane of claim 1, further comprising a cathode material layer on the top surface of the thin film.

13. The ion/proton conducting membrane of claim 12, wherein the cathode material layer is $Ba_{0.5}Sr_{0.5}Co_{0.8}Fe_{0.2}O_{3-\delta}$ (BSCF).

14. The ion/proton conducting membrane of claim 12, wherein the cathode material layer is LaSrCoFeO.

15. The ion/proton conducting membrane of claim 12, wherein the cathode material layer is a metal oxide.

16. The ion/proton conducting membrane of claim 15, wherein the metal oxide is a lithiated nickel oxide.

17. The ion/proton conducting membrane of claim 1, further comprising a substrate.

18. The ion/proton conducting membrane of claim 17, wherein the substrate is an unsupported thin film.

19. The ion/proton conducting membrane of claim 18, wherein the substrate has a thickness of about 20 microns to 30 microns.

20. The ion/proton conducting membrane of claim 17, wherein the substrate includes a porous support.

21. The ion/proton conducting membrane of claim 20, wherein the porous support is stainless steel.

22. The ion/proton conducting membrane of claim 17, wherein the substrate is palladium alloyed with another metal.

23. The ion/proton conducting membrane of claim 22, wherein the another metal includes at least one of silver and copper.

24. The ion/proton conducting membrane of claim 17, wherein the thin film is a hydrothermally-grown, electrochemically-seeded structure that is directly adhered to the substrate.

25. The ion/proton conducting membrane of claim 17, wherein the substrate is a palladium alloy.

26. The ion/proton conducting membrane of claim 25, wherein the alloy is one of palladium/silver and palladium/copper.

27. The ion/proton conducting membrane of claim 17, wherein the substrate is metallic.

28. The ion/proton conducting membrane of claim 17, wherein the substrate is a removable, sacrificial material.

29. The ion/proton conducting membrane of claim 17, wherein the substrate is palladium.

30. The ion/proton conducting membrane of claim 17, wherein the substrate is nickel.

31. The ion/proton conducting membrane of claim 1, wherein the thin film is characterized by an X-ray diffraction pattern having substantially only a (002) reflection peak in a two-$\theta$ range of ±20 to 40 degrees.

32. A hydrogen fuel cell, comprising:
   an anode;
   a cathode; and
   an ion/proton-conducting membrane disposed intermediate the anode and the cathode, wherein the ion/proton-conducting membrane further comprises:
   a hydroxyapatite (HAP) thin film having a thickness t, wherein the HAP thin film is characterized by a plurality of single HAP crystals each having its c-axis oriented normal to the surface of the membrane in the form of a gas-tight film and having substantially no mis-oriented crystals, further wherein each of the single HAP crystals has a crystal domain that substantially spans the film thickness t.

33. The hydrogen fuel cell of claim 32, characterized by a proton conductivity equal to or greater than 1E-6 Siemens per centimeter over a temperature range between about 300° C. to 900° C.

34. The hydrogen fuel cell of claim 32, further comprising a substrate.

35. The hydrogen fuel cell of claim 34, wherein the substrate is a palladium hydrogen substrate.

36. The hydrogen fuel cell of claim 32, wherein the thin film is characterized by an X-ray diffraction pattern having substantially only a (002) reflection peak in a two-θ range of ±20 to 40 degrees.

37. An ion and/or proton conducting membrane, comprising:
   a crystalline ion-conducting thin film having a thickness t, wherein the thin film is characterized by a plurality of single apatite crystals each having a c-axis orientation normal to the surface of the membrane and having substantially no mis-oriented crystals, further wherein the thin film is in the form of a gas-tight film, further wherein each of the single crystals has a crystal domain that substantially spans the film thickness t, further wherein the thin film is characterized by an X-ray diffraction pattern having substantially only a (002) reflection peak in a two-θ range of ±20 to 40 degrees.

38. A hydrogen fuel cell, comprising:
an anode;
a cathode; and
an ion/proton-conducting membrane disposed intermediate the anode and the cathode, wherein the ion/proton-conducting membrane further comprises:
a hydroxyapatite (HAP) thin film having a thickness t, wherein the HAP thin film is characterized by a plurality of single HAP crystals each having its c-axis oriented normal to the surface of the membrane in the form of a gas-tight film and having substantially no mis-oriented crystals, further wherein each of the single HAP crystals has a crystal domain that substantially spans the film thickness t, further wherein the thin film is characterized by an X-ray diffraction pattern having substantially only a (002) reflection peak in a two-θ range of ±20 to 40 degrees.

* * * * *